(12) United States Patent
Kim et al.

(10) Patent No.: US 12,302,690 B2
(45) Date of Patent: May 13, 2025

(54) DISPLAY DEVICE AND METHOD OF FABRICATING THE SAME

(71) Applicant: Samsung Display Co., Ltd., Yongin-si (KR)

(72) Inventors: Ki Bum Kim, Hwaseong-si (KR); Jin Taek Kim, Yongin-si (KR); Sang Hoon Lee, Hwaseong-si (KR); Hyun Wook Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 17/316,505

(22) Filed: May 10, 2021

(65) Prior Publication Data

US 2021/0376281 A1    Dec. 2, 2021

(30) Foreign Application Priority Data

May 29, 2020   (KR) ........................ 10-2020-0065031

(51) Int. Cl.

| | |
|---|---|
| *H01L 27/15* | (2006.01) |
| *H01L 33/38* | (2010.01) |
| *H10K 50/813* | (2023.01) |
| *H10K 50/822* | (2023.01) |
| *H10K 59/122* | (2023.01) |
| *H10K 59/124* | (2023.01) |
| *H10K 71/00* | (2023.01) |

(52) U.S. Cl.
CPC ......... *H10K 50/813* (2023.02); *H10K 50/822* (2023.02); *H10K 59/122* (2023.02); *H10K 59/124* (2023.02); *H10K 71/00* (2023.02)

(58) Field of Classification Search
CPC ............ H01L 27/3246; H01L 27/3258; H01L 51/5209; H01L 51/5225
See application file for complete search history.

(56) References Cited

U.S. PATENT DOCUMENTS

| | | | |
|---|---|---|---|
| 9,287,242 B2 * | 3/2016 | Shibata | ............... H01L 25/0753 |
| 9,443,904 B1 | 9/2016 | Chen et al. | |
| 10,026,777 B2 * | 7/2018 | Kang | ..................... H01L 27/15 |

(Continued)

FOREIGN PATENT DOCUMENTS

| | | |
|---|---|---|
| KR | 10-2019-0096475 A | 8/2019 |
| KR | 10-2020-0004893 A | 1/2020 |

(Continued)

*Primary Examiner* — Vu A Vu
*Assistant Examiner* — Valerie N Newton
(74) *Attorney, Agent, or Firm* — Womble Bond Dickinson (US) LLP

(57) ABSTRACT

A display device and a method of fabricating a display device are provided, the display device comprising a first substrate, first and second electrodes on the first substrate and spaced apart from each other, a first insulating layer covering portions of the first and second electrodes, light-emitting elements on the first insulating layer, a first contact electrode on the first electrode and in contact with first end portions of the light-emitting elements, a second insulating layer on the light-emitting elements and covering a first end portion of the first contact electrode, and a second contact electrode between the second insulating layer and the second electrode, and in contact with second end portions of the light-emitting elements.

17 Claims, 21 Drawing Sheets

(56) References Cited

U.S. PATENT DOCUMENTS

| | | | |
|---|---|---|---|
| 10,263,138 B2 | 4/2019 | Lu | |
| 10,461,123 B2* | 10/2019 | Kim | H01L 27/1255 |
| 10,505,084 B2 | 12/2019 | Lu | |
| 11,074,858 B2 | 7/2021 | Cho et al. | |
| 12,062,739 B2 | 8/2024 | Kim et al. | |
| 12,074,257 B2 | 8/2024 | Li et al. | |
| 2011/0193123 A1* | 8/2011 | Moon | H01L 33/382 |
| | | | 257/E33.072 |
| 2015/0076649 A1* | 3/2015 | Kim | H01L 27/14634 |
| | | | 257/446 |
| 2018/0019377 A1* | 1/2018 | Kim | H01L 33/38 |
| 2018/0175106 A1* | 6/2018 | Kim | H01L 33/60 |
| 2020/0058701 A1* | 2/2020 | Kim | H01L 33/20 |
| 2020/0168777 A1* | 5/2020 | Kang | H01L 25/0753 |
| 2021/0305222 A1* | 9/2021 | Min | H01L 25/0753 |
| 2021/0327954 A1 | 10/2021 | Cho et al. | |
| 2021/0350746 A1 | 11/2021 | Cho et al. | |
| 2021/0391380 A1 | 12/2021 | Li et al. | |

FOREIGN PATENT DOCUMENTS

| | | |
|---|---|---|
| KR | 10-2020-0004936 A | 1/2020 |
| KR | 2020-0006650 A | 1/2020 |
| KR | 2020-0011629 A | 2/2020 |
| KR | 10-2020-0029100 A | 3/2020 |
| KR | 10-2020-0041429 A | 4/2020 |

\* cited by examiner

DISPLAY DEVICE AND METHOD OF FABRICATING THE SAME

CROSS-REFERENCE TO RELATED APPLICATION

This application claims priority to, and the benefit of, Korean Patent Application No. 10-2020-0065031 filed on May 29, 2020 in the Korean Intellectual Property Office, the contents of which in its entirety are herein incorporated by reference.

BACKGROUND

1. Field

The present disclosure relates to a display device, and to a method of fabricating the same.

2. Description of the Related Art

Display devices have increasingly become of importance with the development of multimedia, and various types of display devices, such as an organic light-emitting diode (OLED) display device, a liquid crystal display (LCD) device, or the like, have been used.

Typically, a display device, which is a device for displaying an image, includes a display panel such as an OLED display panel or an LCD panel. The display panel may include light-emitting elements such as light-emitting diodes (LEDs), and the LEDs may be classified into OLEDs using an organic material as a fluorescent material and inorganic LEDs (ILEDs) using an inorganic material as a fluorescent material.

SUMMARY

Embodiments of the present disclosure provide a display device having a reduced number of manufacturing steps, and a method of fabricating the display device.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to the aforementioned and other embodiments of the present disclosure, because light-emitting elements may be fixed with an electrode layer that forms contact electrodes, the number of manufacturing steps of a display device may be reduced. In addition, because an insulating layer that protects the light-emitting elements may be used to pattern the electrode layer, the number of mask processes may be reduced.

Other features and embodiments may be apparent from the following detailed description, the drawings, and the claims.

According to some embodiments of the present disclosure, a display device comprises a first substrate, first and second electrodes on the first substrate and spaced apart from each other, a first insulating layer covering portions of the first and second electrodes, light-emitting elements on the first insulating layer, a first contact electrode on the first electrode and in contact with first end portions of the light-emitting elements, a second insulating layer on the light-emitting elements and covering a first end portion of the first contact electrode, and a second contact electrode between the second insulating layer and the second electrode, and in contact with second end portions of the light-emitting elements.

The first and second contact electrodes may be spaced apart from each other, wherein a height of the first end portion of the first contact electrode facing the second contact electrode is smaller than a height of a second end portion of the second contact electrode facing the first contact electrode.

A portion of a bottom surface of the second insulating layer may be in direct contact with the light-emitting elements, wherein another portion of the bottom surface of the second insulating layer is in direct contact with a top surface of the first end portion of the first contact electrode.

A width of the second insulating layer may decrease from a bottom to a top thereof.

A first side surface of the second insulating layer that is on the first contact electrode may be exposed, wherein a second side surface of the second insulating layer that is opposite to the first side surface of the second insulating layer is covered by the second contact electrode.

A width of the first contact electrode may be greater than a width of the second contact electrode in one direction, wherein contact areas of side surfaces of the light-emitting elements and the first contact electrode are greater than contact areas of side surfaces of the light-emitting elements and the second contact electrode.

The second insulating layer may include an organic insulating material, wherein the first insulating layer includes an inorganic insulating material, and wherein a maximum thickness of the second insulating layer is greater than a thickness of the first insulating layer.

The first end portions of the light-emitting elements may be on the first electrode, wherein the second end portions of the light-emitting elements are on the second electrode.

The first insulating layer may include openings, which expose portions of the first and second electrodes, wherein the first contact electrode is in contact with the exposed portion of the first electrode through the openings, and wherein the second contact electrode is in contact with the exposed portion of the second electrode through the openings.

The display device may further include first banks between the first substrate and the first and second electrodes.

The display device may further include a third electrode between the first and second electrodes, and a fourth electrode between the third and fourth electrodes which are spaced apart from each other by the second electrode, wherein the first banks include first sub-banks which are spaced apart from each other and a second sub-bank which is between the first sub-banks, and wherein the second and third electrodes are spaced apart from each other, on the second sub-bank.

The second insulating layer may include first insulating patterns, which are between the first sub-banks and the second sub-bank, and a second insulating pattern, which is on the second sub-bank.

According to some embodiments of the present disclosure, a display device includes a first substrate, first and second electrodes on the first substrate to be spaced apart from each other, light-emitting elements on the first and second electrodes, a first contact electrode on first end portions of the light-emitting elements and the first electrode, and a second contact electrode on second end portions of the light-emitting elements and the second electrode, and spaced apart from the first contact electrode, wherein a height of an end portion of the second contact electrode is greater than a height of an end portion of the first contact electrode that is opposite to the end portion of the second contact electrode, and wherein side surfaces of the light-emitting elements are exposed between the first and second contact electrodes.

The display device may further include a first insulating layer covering portions of the first and second electrodes, wherein the light-emitting elements are directly on the first insulating layer.

Contact areas of the side surfaces of the light-emitting elements and the first contact electrode may be greater than contact areas of the side surfaces of the light-emitting elements and the second contact electrode.

According to some embodiments of the present disclosure, a method of fabricating a display device includes preparing a substrate where first and second electrodes, which are spaced apart from each other, and a first insulating layer, which covers portions of the first and second electrodes, are formed, arranging light-emitting elements on the first and second electrodes, forming a contact electrode layer on the first and second electrodes and covering the light-emitting elements, forming an organic insulating layer on the contact electrode layer, forming a first contact electrode by patterning the contact electrode layer, forming a second contact electrode on portion of the organic insulating layer, and forming a second insulating layer by removing another portion of the organic insulating layer.

The forming the first contact electrode may include wet etching the contact electrode layer before curing the organic insulating layer, wherein the contact electrode layer is patterned so that an undercut beneath the organic insulating layer is formed in the contact electrode layer.

In the forming the first contact electrode, a material that forms the organic insulating layer may move toward the undercut of the contact electrode layer to be in direct contact at least in part with the light-emitting elements.

The forming the second insulating layer may include removing a portion of the cured organic insulating layer via ashing where the second contact electrode is not formed.

After the forming the first contact electrode, the first and second electrodes may be cut and divided at least in part in an area outside an area where the light-emitting elements are located.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
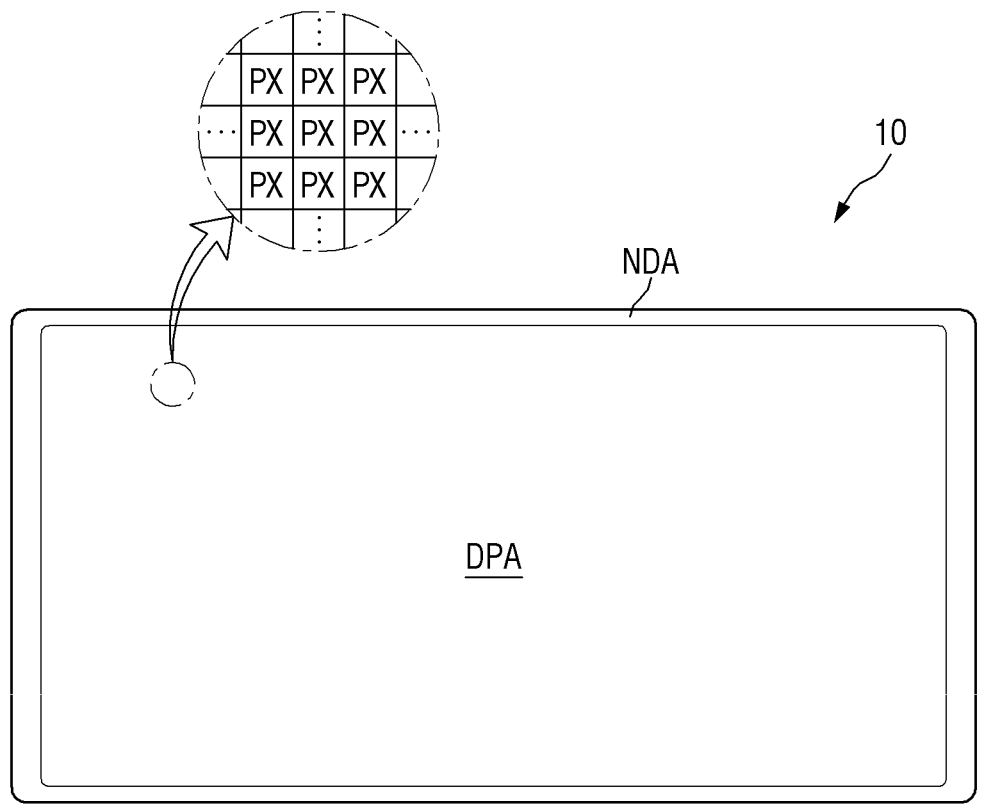
FIG. 1 is a plan view of a display device according to some embodiments of the present disclosure.
Figure 1:
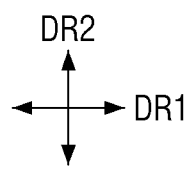

Features of the inventive concept and methods of accomplishing the same may be understood more readily by reference to the detailed description of embodiments and the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments will be described with reference to the attached drawings.

FIG. 1 is a plan view of a display device according to some embodiments of the present disclosure.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the present disclosure is not limited thereto.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a rectangular shape with rounded corners, a polygonal shape, or a circular shape. A display area DPA of the display device 10 may have a similar shape to the display device 10. FIG. 1 illustrates that the display device 10 and the display area DPA have a rectangular shape that extends longer in the horizontal direction than in the vertical direction.

The display device 10 may include the display area DPA and a non-display area NDA. The display area DPA is an area in which a screen is displayed, and the non-display area NDA is an area in which a screen is not displayed. The display area DPA may also be referred to as an active area, and the non-display area NDA may also be referred to as an inactive area. The display area DPA may generally account for a middle portion of the display device 10.

The display area DPA may include a plurality of pixels PX. The pixels PX may be arranged in row and column directions. The pixels PX may have a rectangular or square shape in a plan view, but the present disclosure is not limited thereto. Alternatively, the pixels PX may have a rhombus shape that is inclined with respect to a given direction. The pixels PX may be alternately arranged in a stripe fashion or a PenTile®/PENTILE® fashion (PENTILE® is a registered trademark owned by Samsung Display Co., Ltd.). Each of the pixels PX may include one or more light-emitting elements ED that emit light of a corresponding wavelength range to emit light of a corresponding color.

The non-display area NDA may be located on the periphery of the display area DPA. The non-display area NDA may surround the entire display area DPA or a portion of the display area DPA. The display area DPA may have a rectangular shape, and the non-display area NDA may be located adjacent to four sides of the display area DPA. The non-display area NDA may form the bezel of the display device 10. Wires or circuit drivers included in the display device 10 may be located in the non-display area NDA, or external devices may be mounted in the non-display area NDA.

Figure 2:
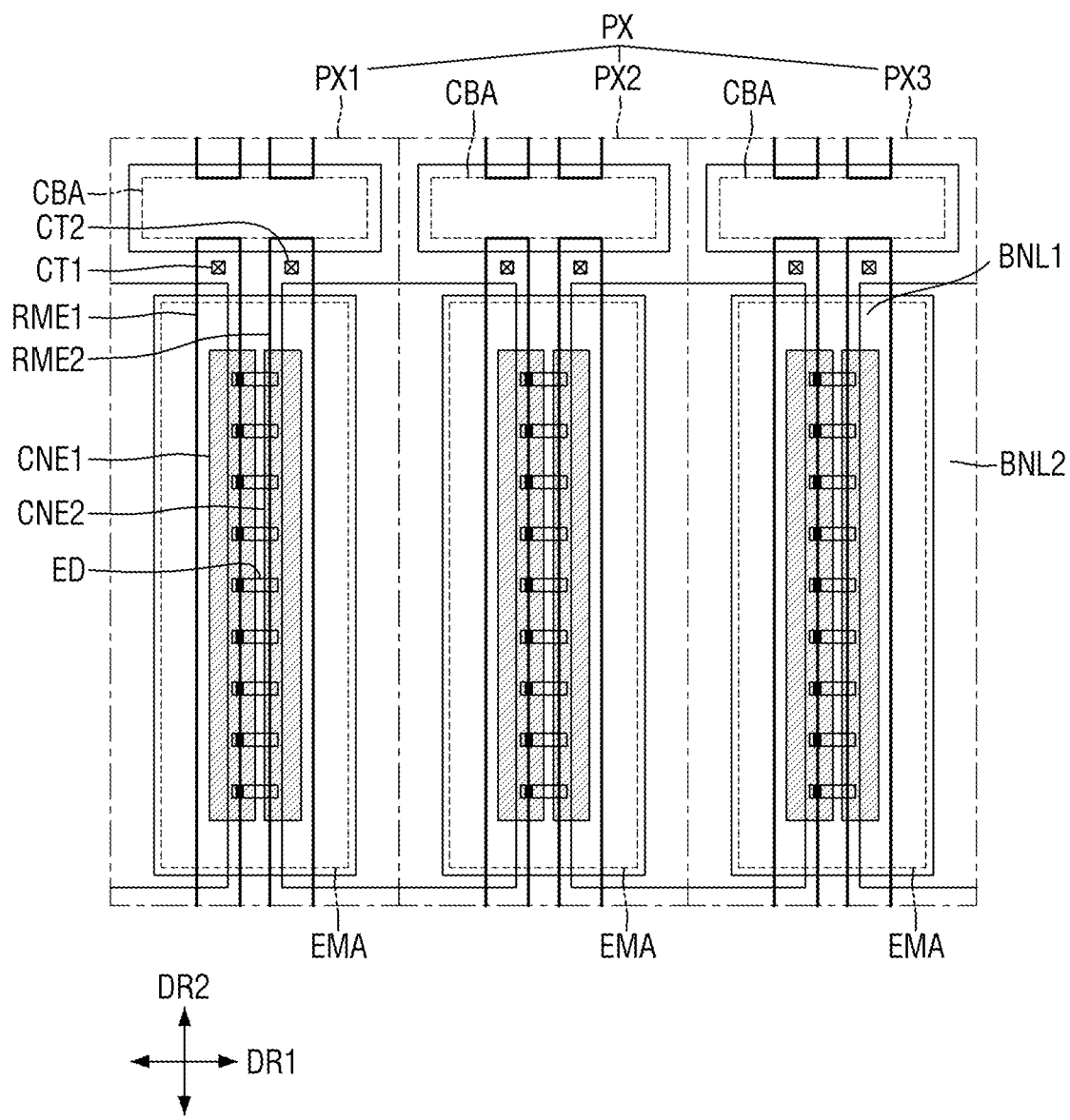
FIG. 2 is a plan view of a pixel of the display device of FIG. 1.

FIG. 2 is a plan view of a pixel of the display device of FIG. 1.

Referring to FIG. 2, a pixel PX may include a plurality of subpixels PXn (e.g., where n is an integer of 1 to 3). For example, the pixel PX may include first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the present disclosure is not limited thereto. Alternatively, the subpixels PXn may emit light of the same color. FIG. 2 illustrates that the pixel PX includes three subpixels PXn, but the present disclosure is not limited thereto. Alternatively, the pixel PX may include more than three subpixels PXn.

Each of the subpixels PXn may include an emission area EMA and a non-emission area. The emission area EMA may be an area in which one or more light-emitting elements ED are located to emit light of a corresponding wavelength range, and the non-emission area may be an area at which light emitted from the light-emitting elements ED does not arrive, and thus no light is emitted therefrom. The emission area EMA may include an area in which the light-emitting elements ED are located, and an area that outputs light emitted from the light-emitting elements ED.

However, the present disclosure is not limited to this. For example, the emission area EMA may further include an area in which light emitted from the light-emitting elements ED is reflected or refracted by another element. A plurality of light-emitting elements ED may be located in the subpixels PXn, and a plurality of emission areas EMA, including areas where the plurality of light-emitting elements ED are located, as well as areas adjacent to the areas where the plurality of light-emitting elements ED are located, may be formed.

Each of the subpixels PXn may include a cut area CBA, which is located in the non-emission area. The cut area CBA may be located on one side (e.g., in a second direction DR2) of the emission area EMA. The cut area CBA may be located between emission areas EMA of a pair of adjacent subpixels PXn in the second direction DR2. For example, in the display area DPA of the display device 10, a plurality of emission areas EMA and a plurality of cut areas CBA may be arranged. For example, the plurality of emission areas EMA or the plurality of cut areas CBA may be respectively arranged one after another in a first direction DR1, and the plurality of emission areas EMA or the plurality of cut areas CBA may be alternately arranged in the second direction DR2.

A second bank BNL2 may be located between the plurality of cut areas CBA and the plurality of emission areas EMA, and the distance between the plurality of cut areas CBA and the plurality of emission areas EMA may vary depending on the width of the second bank BNL2. No light-emitting elements ED are located in the cut area CBA of each of the subpixels PXn so that no light is emitted from the cut area CBA of each of the subpixels PXn, but portions of electrodes RME may be located in the cut area CBA of each of the subpixels PXn to be separate from each other. The electrodes RME may be located to be separate from each other in the cut area CBA of each of the subpixels PXn. However, the present disclosure is not limited to this. Alternatively, the electrodes RME may be located as being undivided in the cut area CBA of each of the subpixels PXn.

Figure 3:
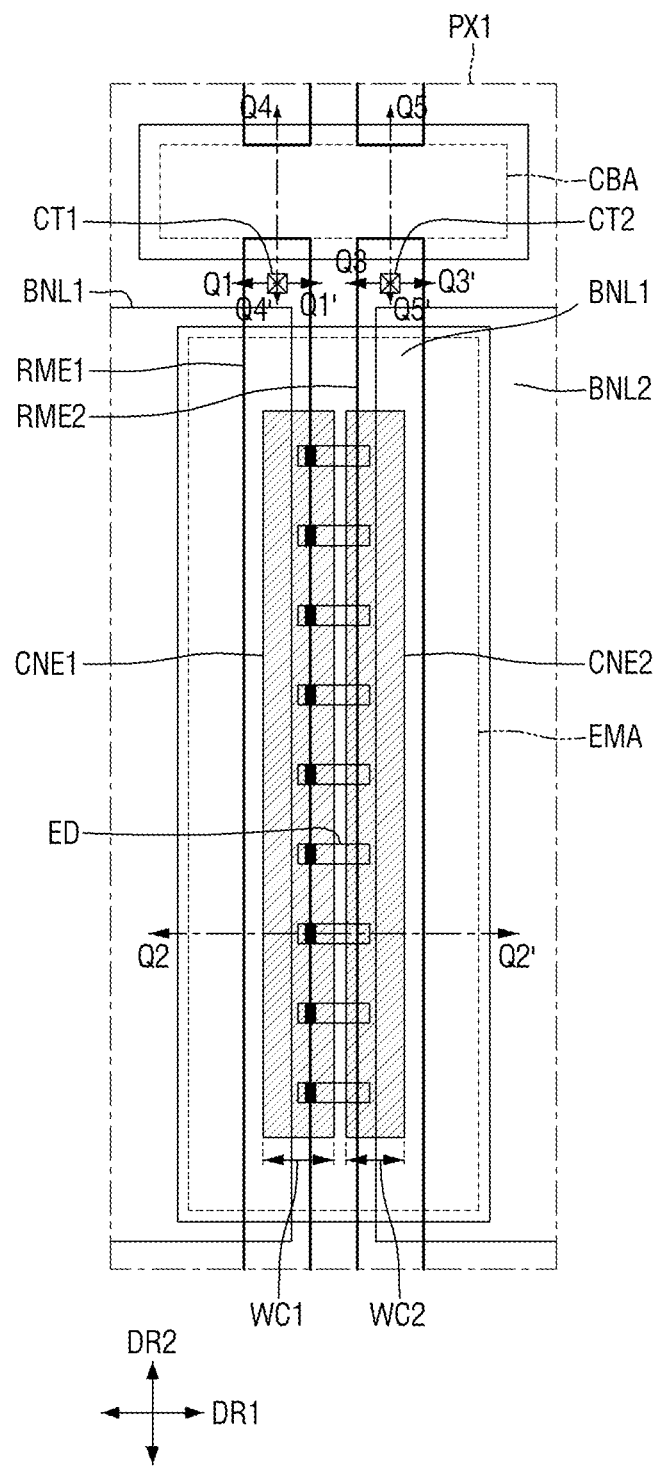
FIG. 3 is a plan view of a first subpixel of FIG. 2.
Figure 4:
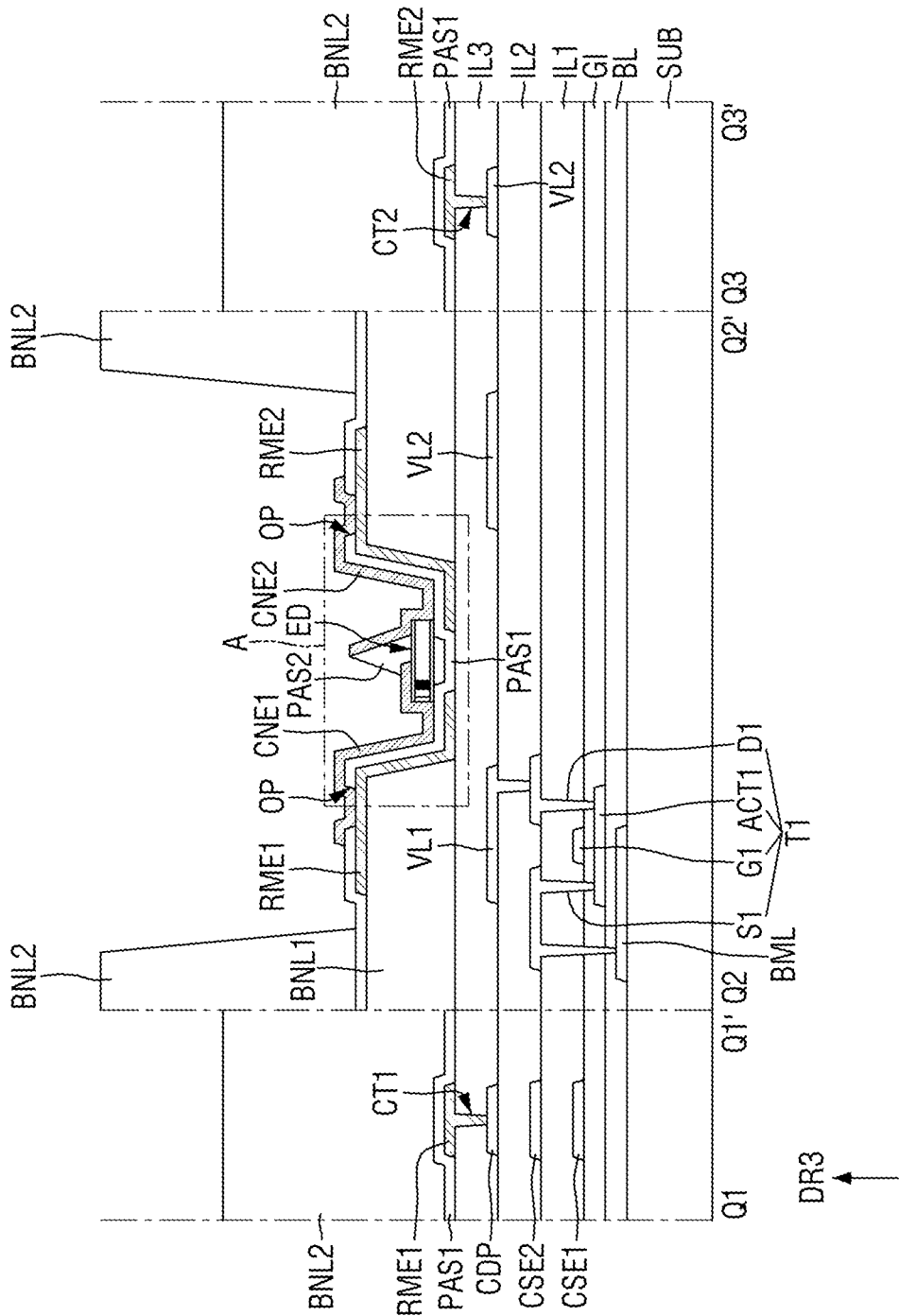
FIG. 4 is a cross-sectional view taken along the lines Q1-Q1', Q2-Q2', and Q3-Q3' of FIG. 3.

FIG. 3 is a plan view of the first subpixel of FIG. 2, and FIG. 4 is a cross-sectional view taken along the lines Q1-Q1', Q2-Q2', and Q3-Q3' of FIG. 3. FIG. 4 illustrates a cross-sectional view taken from one end to the other end of a light-emitting element ED in the first subpixel PX1 of FIG. 2.

Referring to FIGS. 3 and 4 and further to FIG. 2, the display device 10 may include a first substrate SUB and a semiconductor layer, a plurality of conductive layers, and a plurality of insulating layers, which are located on the first substrate SUB. The semiconductor layer, the conductive layers, and the insulating layers may form a circuit layer and a light-emitting element layer of the display device 10.

The first substrate SUB may be an insulating substrate. The first substrate SUB may be formed of an insulating material, such as glass, quartz, or a polymer resin. Also, the first substrate SUB may be a rigid substrate, or may be a flexible substrate that is bendable, foldable, or rollable.

A light-blocking layer BML may be located on the first substrate SUB. The light-blocking layer BML is located to overlap with an active layer ACT1 of a first transistor T1. The light-blocking layer BML may include a material capable of blocking light, and may thus reduce or prevent light incident upon the active layer ACT1 of the first transistor T1. For example, the light-blocking layer BML may be formed of an opaque metal capable of blocking the transmission of light, but the present disclosure is not limited thereto. In some embodiments, the light-blocking layer BML may be omitted.

A buffer layer BL may be located on the first substrate SUB. For example, the buffer layer BL may be located on the entire surface of the first substrate SUB to cover the light-blocking layer BML and the top surface of the first substrate SUB. The buffer layer BL may be formed on the first substrate SUB to protect the first transistor T1 from moisture that may penetrate the first substrate SUB, which is susceptible to moisture, and may perform a surface planarization function.

The semiconductor layer is located on the buffer layer BL. The semiconductor layer may include the active layer ACT1 of the first transistor T1. The semiconductor layer may be located to partially overlap with a gate electrode G1 in a first conductive layer.

FIG. 4 illustrates only the first transistor T1 of the first subpixel PX1, but the number of transistors included in the first subpixel PX1 is not particularly limited. The first subpixel PX1 may include more than one transistor. For example, the first subpixel PX1 may include more than one transistor including the first transistor T1 (e.g., two or three transistors).

The semiconductor layer may include polycrystalline silicon, monocrystalline silicon, or an oxide semiconductor. In a case where the semiconductor layer includes an oxide semiconductor, the active layer ACT1 may include a plurality of conductor regions, and a channel region between the conductor regions. The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO), but the present disclosure is not limited thereto.

Alternatively, the semiconductor layer may include polycrystalline, which is formed by crystallizing amorphous silicon. In this case, the conductor regions of the active layer ACT1 may be regions doped with impurities.

A first gate insulating layer GI is located on the semiconductor layer and the buffer layer BL. For example, the first gate insulating layer GI may be located on the entire surface of the buffer layer BL to cover the semiconductor layer and the top surface of the buffer layer BL. The first gate insulating layer GI may function as the gate insulating film of each transistor.

The first conductive layer is located on the first gate insulating layer GI. The conductive layer may include the gate electrode G1 of the first transistor T1, and a first capacitor electrode CSE1 of a storage capacitor. The gate electrode G1 may be located to overlap with the channel region of the active layer ACT1 in a thickness direction. The first capacitor electrode CSE1 may be located to overlap with a second capacitor electrode CSE2 in the thickness direction. The first capacitor electrode CSE1 may be connected to, and integrally formed with, the gate electrode G1. The first capacitor electrode CSE1 may be located to overlap with the second capacitor electrode CSE2 in the thickness direction so that the storage capacitor may be formed by the first capacitor electrode CSE1 and the second capacitor electrode CSE2.

A first interlayer insulating layer IL1 is located on the first conductive layer. The first interlayer insulating layer IL1 may perform the functions of an insulating film between the first conductive layer and other layers located thereon. A first interlayer insulating layer IL1 may be located to cover the first conductive layer and protect the first conductive layer.

A second conductive layer is located on the first interlayer insulating layer IL1. The second conductive layer may include a first source electrode S1, a second drain electrode D1, and the second capacitor electrode CSE2.

The first source electrode S1 and the first drain electrode D1 of the first transistor T1 may be in contact with the conductor regions of the active layer ACT1 via respective contact holes that penetrate the first interlayer insulating layer IL1 and the first gate insulating layer GI. The first source electrode S1 of the first transistor T1 may be in contact with the light-blocking layer BML via another contact hole.

The second capacitor electrode CSE2 may be located to overlap with the first capacitor electrode CSE1 in the thickness direction. For example, the second capacitor electrode CSE2 may be integrally formed with, and connected to, the first source electrode S1.

In some embodiments, the second conductive layer may further include a data line, which applies a data signal to the other transistors. The data line may be connected to source and/or drain electrodes of the other transistors, and may thus transmit a signal applied thereto to the source and/or drain electrodes of the other transistors.

The second interlayer insulating layer IL2 is located on the second conductive layer. The second interlayer insulating layer IL2 may function as an insulating film between the second conductive layer and layers located on the first conductive layer. Also, the second interlayer insulating layer IL2 may cover the second conductive layer to protect the second conductive layer.

A third conductive layer is located on the second interlayer insulating layer IL2. The third conductive layer may include a first voltage line VL1, a second voltage line VL2, and a first conductive pattern CDP. A high-potential voltage (or a first power supply voltage) provided to the first transistor T1 may be applied to the first voltage line VL1, and a low-potential voltage (or the second power supply voltage) provided to a second electrode RME2 may be applied to the second voltage line VL2.

The first and second voltage lines VL1 and VL2 of the third conductive layer may be located to extend in the second direction DR2. The first voltage line VL1 may include portions that extend in the second direction DR2, and that are then bent in a direction between the first and second directions DR1 and DR2. Conversely, the second voltage line VL2 may extend in the second direction DR2 without being bent. The first and second voltage lines VL1 and VL2 may be located to respectively overlap with a plurality of electrodes RME1, RME2 in the thickness direction. The portions of the first voltage line VL1 that extend in the second direction DR2, and that are then bent in a direction between the first and second directions DR1 and DR2, may be located within the emission area EMA. The second voltage line VL2 may be located to extend across the emission area EMA.

The first conductive pattern CDP may be connected to the second capacitor electrode CSE2 through a contact hole that is formed in the second interlayer insulating layer IL2. The second capacitor electrode CSE2 may be integrally formed with the first source electrode S1, and the first conductive pattern CDP may be electrically connected to the first source electrode S1. The first conductive pattern CDP may be in contact with a first electrode RME1, and the first transistor T1 may transmit the first power supply voltage applied thereto from the first voltage line VL1 to the first electrode RME1 via the first conductive pattern CDP. The third conductive layer is illustrated as including one first voltage line VL1 and one second voltage line VL2, but the present disclosure is not limited thereto. The third conductive layer may include more than one first voltage line VL1 and more than one second voltage line VL2.

Each of the buffer layer BL, the first gate insulating layer GI, the first interlayer insulating layer IL1, and the second interlayer insulating layer IL2 may include a plurality of inorganic layers that are alternately stacked. For example, each of the buffer layer BL, the first gate insulating layer GI, the first interlayer insulating layer IL1, and the second interlayer insulating layer IL2 may be formed as a multilayer film in which inorganic layers including at least one of silicon oxide (SiOx), silicon nitride (SiNx), and silicon oxynitride (SiOxNy) are alternately stacked.

Each of the first, second, and third conductive layers may be formed as a single-layer or multilayer film including at least one of molybdenum (Mo), aluminum (Al), chromium (Cr), gold (Au), titanium (T1), nickel (Ni), neodymium (Nd), copper (Cu), and an alloy thereof, but the present disclosure is not limited thereto.

A third interlayer insulating layer IL3 is located on the third conductive layer. The third interlayer insulating layer IL3 may include an organic insulating material such as PI, and may perform a surface planarization function.

A plurality of first banks BNL1, the electrodes RME1, RME2, the light-emitting elements ED, a plurality of contact electrodes CNE1, CNE2, and the second bank(s) BNL2 are located, as a display element layer, on the third interlayer insulating layer IL3. A plurality of insulating layers PAS1, PAS2 may be located on the third interlayer insulating layer IL3.

The first banks BNL1 may be located directly on the third interlayer insulating layer IL3. One first bank BNL1 may extend in the first direction DR1 and may be located in and/or across a pair of adjacent subpixels PXn. One first bank BNL1 may also extend in the second direction DR2, and may be spaced apart from another first bank BNL1 in the same subpixel PXn. That is, the first banks BNL1 may extend to have a width(s) (e.g., a predetermined width(s)) in the first and second directions DR1 and DR2, and may be located, in part, in the emission area EMA, and, in part, between a pair of adjacent subpixels PXn in the first direction DR1. The length of the first banks BNL1 in the second direction DR2 may be greater than the length of the emission area EMA in the second direction DR2, such that portions of the first banks BNL1 may overlap with the second bank BNL2 in the non-emission area.

A plurality of first banks BNL1 may be located in the first subpixel PX1. For example, portions of two first banks BNL1 may be located in the emission area EMA of the first subpixel PX1. The two first banks BNL1 may be spaced apart from each other in the first and second directions DR1 and DR2. The light-emitting elements ED may be located between a pair of first banks BNL1 spaced apart from each other in the first direction DR1. FIGS. 3 and 4 illustrate that two first banks BNL1 are located in the emission area EMA to form island patterns, but the present disclosure is not limited thereto. The number of first banks BNL1 located in the emission area EMA may vary depending on the number of electrodes RME1, RME2 or depending on the arrangement of the light-emitting elements ED.

The first banks BNL1 may protrude, at least in part, from the top surface of the third interlayer insulating layer IL3. Portions of the first banks BNL1 that protrude may have inclined sides surfaces, and light emitted from the light-emitting elements ED may be reflected by the electrodes RME on the first banks BNL1 to be emitted in an upward direction from the third interlayer insulating layer IL3. The first banks BNL1 might not only provide an area in which to arrange the light-emitting elements ED, but also may function as a reflecting barrier capable of reflecting light emitted from the light-emitting elements ED in the upward direction from the third interlayer insulating layer IL3. The sides of the first banks BNL1 may be linearly inclined, but the present disclosure is not limited thereto. Alternatively, the first banks BNL1 may have a semi-circular or elliptical shape with a curved outer surface. The first banks BNL1 may include an organic insulating material such as PI, but the present disclosure is not limited thereto.

The electrodes RME1, RME2 may extend in one direction and may be located in the first subpixel PX1. The electrodes RME1, RME2 may extend in the second direction DR2 and may be located in the first subpixel PX1 to be spaced apart from each other in the first direction DR1. The first and second electrodes RME1 and RME2, which are spaced apart from each other in the first direction DR1, may be located in the first subpixel PX1. A plurality of light-emitting elements ED may be located on the first and second electrodes RME1 and RME2. However, the present disclosure is not limited thereto. The number of electrodes RME1, RME2 and the locations of the electrodes RME1, RME2 may vary depending on the number of light-emitting elements ED located in each of the subpixels PXn.

The first and second electrodes RME1 and RME2 may be located in the emission area EMA, and may extend beyond the emission area EMA to overlap, in part, with the second bank BNL2 in the thickness direction. The electrodes RME1, RME2 may extend in the second direction DR2 in the first subpixel PX1, and may be spaced apart from electrodes RME1, RME2 of a neighboring subpixel PXn of the first subpixel PX1 in the second direction DR2.

The electrodes RME1, RME2 may be obtained by cutting and dividing electrode lines, which extend in the second direction DR2, after the arrangement of the light-emitting elements ED. The electrode lines may be used to generate an electric field in the first subpixel PX1 to align the light-emitting elements ED during the fabrication of the display device 10. The light-emitting elements ED may be sprayed onto the electrode lines via inkjet printing, and once ink including the light-emitting elements ED is sprayed onto the electrode lines, an electric field may be generated by applying an alignment signal to the electrode lines. The light-emitting elements ED may be placed on the electrodes RME1, RME2 by the electric field generated between the electrode lines. The light-emitting elements ED scattered in the ink may receive an electrophoretic force from the electric field, and thus may be arranged on the electrodes RME1, RME2, RME3, RME4. Thereafter, the electrodes RME1, RME2 may be formed by cutting and dividing some of the electrode lines.

The electrodes RME1, RME2 may be connected to the third conductive layer so that signals for causing the light-emitting elements ED to emit light may be applied to the electrodes RME1, RME2. The first electrode RME1 may be in contact with the first conductive pattern CDP through a first contact hole CT1 that penetrates the third interlayer insulating layer IL3. The second electrode RME2 may be in contact with the second voltage line VL2 through a second contact hole CT2 that penetrates the third interlayer insulating layer IL3. The first electrode RME1 may be electrically connected to the first transistor T1 via the first conductive pattern CDP so that the first power supply voltage may be applied to the first electrode RME1, and the second electrode RME2 may be electrically connected to the second voltage line VL2 via the first conductive pattern CDP so that the second power supply voltage may be applied to the second electrode RME2. The electrodes RME1, RME2 may be electrically connected to the light-emitting elements ED. The electrodes RME1, RME2 may be connected to respective end portions of each of the light-emitting elements ED via the contact electrodes CNE1, CNE2, and may transmit electrical signals applied thereto from the third conductive layer to the light-emitting elements ED. The electrodes RME1, RME2 may be cut and divided in the first subpixel PXn so that the light-emitting elements ED of the first subpixel PX1 may emit light separately from light-emitting elements ED of another subpixel PXn.

The first and second contact holes CT1 and CT2 are illustrated as being formed in areas that overlap with the second bank BNL2, but the present disclosure is not limited thereto. For example, the contact holes CT1, CT2 may be located in the emission area EMA surrounded by the second bank BNL2.

The electrodes RME1, RME2 may be located on the first banks BNL1, which are spaced apart from each other. The electrodes RME1, RME2 may be located on inclined side surfaces of the first banks BNL1 with respect to the first direction DR1. The width of the electrodes RME1, RME2 in the first direction DR1 may be smaller than the width of the first banks BNL1 in the first direction DR1. The electrodes RME1, RME2 may be located to cover at least one side surface of each of the first banks BNL1, and thus may reflect light emitted from the light-emitting elements ED.

The distance between the electrodes RME1, RME2 in the first direction DR1 may be smaller than the distance between the first banks BNL1 in the first direction DR1. The electrodes RME1, RME2 may be located directly on the third interlayer insulating layer IL3, and thus may fall on the same plane.

The electrodes RME1, RME2 may transmit electrical signals for causing the light-emitting elements ED to emit light, and may be used to generate an electric field in the first subpixel PX1 to align the light-emitting elements ED during the fabrication of the display device 10. The light-emitting elements ED may be sprayed onto the electrodes RME1, RME2 via inkjet printing. Once ink including the light-emitting elements ED is sprayed, an electric field is generated by applying alignment signals to the electrodes RME1, RME2. The light-emitting elements ED scattered in the ink may receive a dielectrophoretic force from the electric field, and thus may be arranged on the electrodes RME1, RME2.

The electrodes RME1, RME2 may include a conductive material with high reflectance. For example, the electrodes RME1, RME2 may include a metal with high reflectance such as silver (Ag), Cu, or Al or may include an alloy of Al, Ni, or lanthanum (La). The electrodes RME1, RME2 may reflect light, emitted from the light-emitting elements ED to travel toward the sides of the first banks BNL1, in an upward direction from the first subpixel PX1.

However, the present disclosure is not limited to this, and the electrodes RME1, RME2 may further include a transparent conductive material. For example, the electrodes RME1, RME2 may include a material such as ITO, IZO, or ITZO. In some embodiments, each of the electrodes RME1, RME2 may form a structure in which a transparent conductive material and a metal with high reflectance are stacked into more than one layer, or may be formed as a single layer including a transparent conductive material and a metal with high reflectance. For example, each of the electrodes RME1, RME2 may have a stack of ITO/Ag/ITO, ITO, ITO/Ag/IZO, or ITO/Ag/ITZO/IZO.

A first insulating layer PAS1 is located on the electrodes RME1, RME2 and on the first banks BNL1. The first insulating layer PAS1 may be located to cover the first banks BNL1 and the first and second electrodes RME1 and RME2, but may expose portions of the top surfaces of the first and second electrodes RME1 and RME2. Openings OP, which expose the top surfaces of portions of the first and second electrodes RME1 and RME2 located on the first banks BNL1, may be formed in the first insulating layer PAS1, and the contact electrodes CNE1, CNE2 may be in contact with the electrodes RME1, RME2 through the openings OP.

The first insulating layer PAS1 may be formed to have a top surface recessed, in part, between the first and second electrodes RME1 and RME2.

Because the first insulating layer PAS1 is located to cover the first and second electrodes RME1 and RME2, the first insulating layer PAS1 may be formed to be stepped between the first and second electrodes RME1 and RME2, but the present disclosure is not limited thereto. The first insulating layer PAS1 may protect the first and second electrodes RME1 and RME2, and may insulate the first and second electrodes RME1 and RME2 from each other. Also, the first insulating layer PAS1 may reduce or prevent direct contact between the light-emitting elements ED and other elements, thereby avoiding damage.

The second bank BNL2 may be located on the first insulating layer PAS1. In a plan view, the second bank BNL2 may include portions that extend in the first direction DR1, and portions that extend in the second direction DR2, and thus may be arranged in a lattice pattern. The second bank BNL2 may be located along the boundaries of each of the subpixels PXn to define each of the subpixels PXn. Also, the second bank BNL2 may be located to surround the emission area EMA and the cut area CBA of each of the subpixels PXn to thereby separate the emission area EMA and the cut area CBA of each of the subpixels PXn. Portions of the second bank BNL2 that extend in the second direction DR2 may have a greater width between emission areas EMA than between cut areas CBA. The distance between cut areas CBA may be smaller than the distance between emission areas EMA.

The second bank BNL2 may be formed to have a greater height than the first banks BNL1. The second bank BNL2 may reduce or prevent ink from spilling over between different subpixels PXn during an inkjet printing process during the fabrication of the display device 10, and may divide areas of ink having the light-emitting elements 30 scattered therein between different subpixels PXn to reduce or prevent mixture of the ink. Because each of the first banks BNL1 is located in and across a pair of adjacent subpixels PXn in the first direction DR1, portions of the second bank BNL2 that extend in the second direction DR2 may be located on the first banks BNL1. The second bank BNL2, like the first banks BNL1, may include polyimide, but the present disclosure is not limited thereto.

The light-emitting elements ED may be located on the first insulating layer PAS1. A plurality of light-emitting elements ED may be located to be spaced apart from one another in the direction in which the electrodes RME1, RME2 extend (e.g., in the second direction DR2), and may be aligned substantially in parallel to one another. The light-emitting elements ED may extend in one direction, and the direction in which the electrodes RME1, RME2 extend may form a substantially right angle with the direction in which the light-emitting elements ED extend. However, the present disclosure is not limited to this. Alternatively, the light-emitting elements ED may be arranged diagonally with respect to the direction in which the electrodes RME1, RME2 extend.

Each of the light-emitting elements ED may include semiconductor layers doped to have different conductivity types. Each of the light-emitting elements ED may include a plurality of semiconductor layers, and may be aligned to face a given direction at one end thereof in accordance with the direction of an electric field formed on the electrodes RME1, RME2. Each of the light-emitting elements ED may further include a light-emitting layer 36 (of FIG. 7), and may thus emit light of a corresponding wavelength range. Light-emitting elements ED located in different subpixels PXn may emit light of different wavelength ranges. However, the present disclosure is not limited thereto. Alternatively, light-emitting elements located in different subpixels PXn may emit light of the same color.

The light-emitting elements ED may be located on the electrodes RME1, RME2 between the first banks BNL1. For example, first end portions of the light-emitting elements ED may be located on the first electrode RME1, and second end portions of the light-emitting elements ED may be located on the second electrode RME2. The length of the light-emitting elements ED may be greater than the distance between the first and second light-emitting elements RME1 and RME2, and respective end portions of each of the light-emitting elements ED may be located on the first and second electrodes RME1 and RME2.

In each of the light-emitting elements ED, a plurality of layers may be located in a direction perpendicular to the top surface of the first substrate SUB. The direction in which the light-emitting elements ED extend may be located to be parallel to the first substrate SUB, and the semiconductor layers included in each of the light-emitting elements ED may be sequentially arranged along a direction parallel to the top surface of the first substrate SUB. However, the structure of the light-emitting elements ED is not particularly limited. Alternatively, the layers included in each of the light-emitting elements ED may be arranged along the direction perpendicular to the top surface of the first substrate SUB.

Respective end portions of each of the light-emitting elements ED may be in contact with the contact electrodes CNE1, CNE2. An insulating film 38 (of FIG. 7) might not be formed at one end of each of the light-emitting elements ED so that some of the semiconductor layers of each of the light-emitting elements ED may be exposed and may be in contact with the contact electrodes CNE1, CNE2, but the present disclosure is not limited thereto. Alternatively, the insulating film 38 may be partially removed so that the sides of the semiconductor layers of each of the light-emitting elements ED may be partially exposed. The exposed sides of the semiconductor layers of each of the light-emitting elements ED may be in direct contact with the contact electrodes CNE1, CNE2.

A first contact electrode CNE1, a second insulating layer PAS2, and a second contact electrode CNE2 are located on the light-emitting elements ED.

The first contact electrode CNE1 may be located on, and in contact with, the first electrode RME1, and may be located on the first end portions of the light-emitting elements ED. For example, the first contact electrode CNE1 may be formed in the first insulating layer PAS1, and may be in contact with the first electrode RME1 through an opening OP that is formed in the first insulating layer PAS1 to expose a portion of the top surface of the first electrode RME1, and may be in contact with the first end portions of the light-emitting elements ED that are located on the first electrode RME1. The semiconductor layers of each of the light-emitting elements ED may be exposed at both ends of each of the light-emitting elements ED, and the first contact electrode CNE1 may be in contact with the exposed semiconductor layers and the side surfaces of the light-emitting elements ED. The first contact electrode CNE1 may extend in the second direction DR2 in a plan view to form a linear pattern in the emission area EMA. The first end portions of the light-emitting elements ED may be electrically connected to the first electrode RME1 via the first contact electrode CNE1.

The second insulating layer PAS2 may be located, in part, on the first contact electrode CNE1 and the light-emitting elements ED. For example, the second insulating layer PAS2 may be located on, and cover, one end portion of the first contact electrode CNE1 that is in contact with the light-emitting elements ED. The second insulating layer PAS2 may be located to surround portions of the outer surfaces of the light-emitting elements ED, but not to cover the second end portions of the light-emitting elements ED. As a result, the first end portions of the light-emitting elements ED may be covered by the first contact electrode CNE1, and the second end portions of the light-emitting elements ED may be covered by the second contact electrode CNE2. The second insulating layer PAS2 may protect the light-emitting elements ED, and may fix the light-emitting elements ED during the fabrication of the display device 10. Also, the second insulating layer PAS2 may be located to fill the gap between the light-emitting elements ED and the first insulating layer PAS1.

The second contact electrode CNE2 may be located on, and in contact with, the second electrode RME2 and the second end portions of the light-emitting elements ED. For example, the second contact electrode CNE2 may be in contact with the second electrode RME2 through an opening OP that is formed in the first insulating layer PAS1 to expose a portion of the top surface of the second electrode RME2, and may be in contact with the second end portions of the light-emitting elements ED located on the second electrode RME2. The semiconductor layers at both ends of each of the light-emitting elements ED may be exposed, and the second contact electrode CNE2 may be in contact with the exposed semiconductor layers and the side surfaces of the light-emitting elements ED. The second contact electrode CNE2 may be spaced apart from the first contact electrode CNE1, and may extend in the second direction DR2 in a plan view to form a linear pattern in the emission area EMA. The second end portions of the light-emitting elements ED may be electrically connected to the second electrode RME2 via the second contact electrode CNE2.

FIGS. 2 through 4 illustrate that one first contact electrode CNE1 and one second contact electrode CNE2 are located in each of the subpixels PXn, but the present disclosure is not limited thereto. The numbers of first contact electrodes CNE1 and second contact electrodes CNE2 may vary depending on the numbers of first electrodes RME1 and second electrodes RME2 in each of the subpixels PXn.

The contact electrodes CNE1, CNE2 may include a conductive material. For example, the contact electrodes CNE1, CNE2 may include ITO, IZO, IZTO, or Al. For example, the contact electrodes CNE1, CNE2 may include a transparent conductive material, and light emitted from the light-emitting elements ED may travel toward the electrodes RME1, RME2 through the contact electrodes CNE1, CNE2. However, the present disclosure is not limited to this.

The second insulating layer PAS2 may insulate the first and second contact electrodes CNE1 and CNE2 from each other. In a cross-sectional view, the second insulating layer PAS2 may be located in the gap between the first and second contact electrodes CNE1 and CNE2 to cover a portion of the first contact electrode CNE1, and the second contact electrode CNE2 may be located, in part, on the second insulating layer PAS2.

Figure 5:
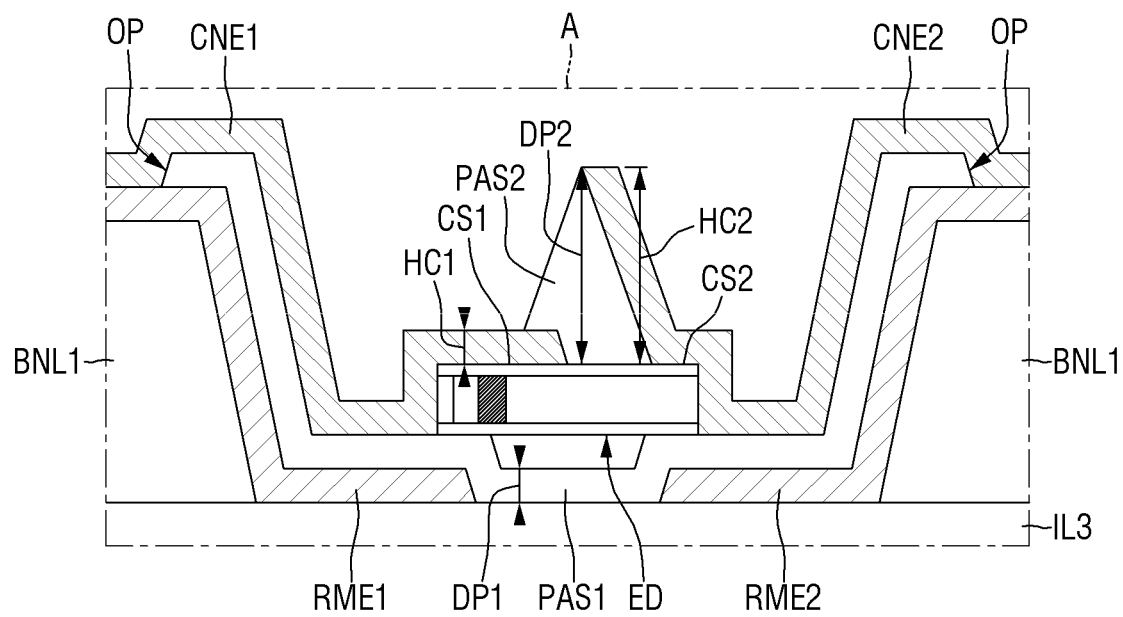
FIG. 5 is an enlarged cross-sectional view of the portion A of FIG. 4.

FIG. 5 is an enlarged cross-sectional view of the portion A of FIG. 4.

Referring to FIG. 5 and further to FIGS. 3 and 4, the first and second contact electrodes CNE1 and CNE2 may be spaced apart from each other and may be located on respective end portions of each of the light-emitting elements ED. For example, a first end portion of the first contact electrode CNE1 that faces the second contact electrode CNE2 may be located on the first end portions of the light-emitting elements ED, and a second end portion of the second contact electrode CNE2 that faces the first contact electrode CNE1 may be located on the second end portions of the light-emitting elements ED. The second insulating layer PAS2 may be located between the first and second contact electrodes CNE1 and CNE2, and may insulate the first and second contact electrodes CNE1 and CNE2 from each other. The width of the second insulating layer PAS2 may be smaller than the length of the light-emitting elements ED, and both end portions of each of the light-emitting elements ED where the second insulating layer PAS2 is not located may be in contact with the first and second contact electrodes CNE1 and CNE2. FIG. 5 illustrates that the second insulating layer PAS2 has inclined side surfaces and has a triangular shape, but the present disclosure is not limited thereto.

A width WC1 of the first contact electrode CNE1 may be greater than a width WC2 of the second contact electrode CNE2, and a first contact area CS1 of the first contact electrode CNE1 and the side surface of each of the light-emitting elements ED may be greater than a second contact area CS2 of the second contact electrode CNE2 and the side surface of each of the light-emitting elements ED. The first and second contact electrodes CNE1 and CNE2 may be in contact with respective ends and/or portions of the side surface of each of the light-emitting elements ED. Opposing end portions of the first and second contact electrodes CNE1 and CNE2 are located on the side surfaces of each of the light-emitting elements ED. Because the first and second contact electrodes CNE1 and CNE2 are formed to have different widths (e.g., the widths WC1 and WC2), respectively, the contact areas CS1 and CS2 may differ from each other.

For example, the first and second contact electrodes CNE1 and CNE2 may be spaced apart from each other in the first direction DR1, the first and second electrodes RME1 and RME2 may be spaced apart from each other in the first direction DR1, and the distance between the first and second contact electrodes CNE1 and CNE2 may be smaller than the distance between the first and second electrodes RME1 and RME2. However, the center of the gap between the first and second contact electrodes CNE1 and CNE2 might not be aligned with the center of the gap between the first and second electrodes RME1 and RME2. As the width WC1 of the first contact electrode CNE1 is greater than the width WC2 of the second contact electrode CNE2, the first end portion of the first contact electrode CNE1 may be located adjacent to the center of the gap between the first and second electrodes RME1 and RME2, and the second end portion of the second contact electrode CNE2 may be located adjacent to the second electrode RME2 while in the gap between the first and second electrodes RME1 and RME2. Thus, the contact area CS1 of the first contact electrode CNE1 and the side surface of each of the light-emitting elements ED may be greater than the second contact area CS2 of the second contact electrode CNE2 and the side surface of each of the light-emitting elements ED. However, the present disclosure is not limited to this, and the width WC1 of the first contact electrode CNE1 is not necessarily greater than the width WC2 of the second contact electrode CNE2.

The first insulating layer PAS1 may include an inorganic insulating material, whereas the second insulating layer PAS2 may include an organic insulating material. A maximum thickness DP2 of the second insulating layer PAS2 may be greater than a thickness DP1 of the first insulating layer DP1. The first insulating layer PAS1, which may include an inorganic insulating material, may be formed to have a relatively uniform thickness and to cover portions of the first and second electrodes RME1 and RME2, and may have a stepped shape depending on the shape of the first and second electrodes RME1 and RME2 located therebelow. On the contrary, the second insulating layer PAS2, which may include an organic insulating material, may have a greater thickness than the first insulating layer PAS1, and may have a flat top surface regardless of the shapes of the first contact electrode CNE1 and the light-emitting elements ED located therebelow.

The second insulating layer PAS2 may be formed after forming a layer for fixing the light-emitting elements ED during the formation of the first contact electrode CNE1. The second insulating layer PAS2 may be formed by forming a layer of an organic insulating material, and by patterning the layer of the organic insulating material after the formation of the contact electrodes CNE1, CNE2. If the layer for fixing the light-emitting elements ED is patterned when the organic insulating material is yet to be cured, the organic insulating material may move with fluidity. The first contact electrode CNE1 may be formed by patterning the layer for fixing the light-emitting elements ED, and the layer of the organic insulating material may cover the first end portion of the first contact electrode CNE1 during the formation of the first contact electrode CNE1. Concurrently or substantially simultaneously, a portion of the bottom surface of the second insulating layer PAS2 may be in direct contact with the top surface of the first end portion of the first contact electrode CNE1, and another portion of the bottom surface of the second insulating layer PAS2 may be in direct contact with the light-emitting elements ED. When the layer of the organic insulating material is yet to be formed, a layer for forming the first contact electrode CNE1 is located on the light-emitting elements ED, and thus, the second insulating layer PAS2 may be in direct contact with the top surface of the first end portion of the first contact layer CNE1. Because portions of the top surfaces of the light-emitting elements ED are exposed when the first contact electrode CNE1 is formed, the exposed portions of the top surfaces of the light-emitting elements ED and the second insulating layer PAS2 may be in direct contact with each other. The second insulating layer PAS2, which is obtained by patterning the layer of the organic insulating material, may cover the first end portion of the first contact electrode CNE1, and may be located between the first and second contact electrodes CNE1 and CNE2 to insulate the first and second contact electrodes CNE1 and CNE2 from each other. The fabrication of the display device 10 will be described later in detail.

The second insulating layer PAS2 may be formed to have a first side surface exposed on the first contact electrode CNE1, and a second side surface, which is opposite to the first side surface, and which is covered by the second contact electrode CNE2. The first side surface of the second insulating layer PAS2 may be formed by patterning the layer of the organic insulating material for forming the second insulating layer PAS2 after the formation of the first contact electrode CNE1. Because the layer of the organic insulating material for forming the second insulating layer PAS2 is patterned after the arrangement of the second contact electrode CNE2, and because no layers are located on the layer of the organic insulating layer, the first side surface of the second insulating layer PAS2 may be exposed. The second side surface of the second insulating layer PAS2 may be covered by the second contact electrode CNE2 after the patterning of the first contact electrode CNE1 using the layer of the organic insulating material for forming the second insulating layer PAS2 as a mask. During the fabrication of the display device 10, the second insulating layer PAS2 may be formed by patterning the layer of the organic insulating material for forming the second insulating layer PAS2 using the second contact electrode CNE2 as a mask, and both side surfaces of the second insulating layer PAS2 may be formed to be inclined in a cross-sectional view. The second insulating layer PAS2 may have a shape in which the width thereof gradually decreases from the bottom to the top thereof.

The second insulating layer PAS2 may be located on the first end portion of the first contact electrode CNE1, the second contact electrode CNE2 may be located on the second side surface of the second insulating layer PAS2, and a height HC2 of the second end portion of the second contact electrode CNE2 may be greater than a thickness HC1 of the first end portion of the first contact electrode CNE1. Because the organic insulating material for forming the second insulating layer PAS2 is provided after the formation of the first contact electrode CNE1, the first contact electrode CNE1 may have a uniform thickness, and may be stepped by conforming to the shapes of the elements located therebelow. The second contact electrode CNE2 may also have a uniform thickness and may be stepped. For example, a portion of the second contact electrode CNE2 on the second side surface of the second insulating layer PAS2 may be higher than the first contact electrode CNE1.

Because the second insulating layer PAS2 includes an organic insulating material, the second insulating layer PAS2 may insulate the first and second contact electrodes CNE1 and CNE2 from each other by being between the first and second contact electrodes CNE1 and CNE2. During the fabrication of the display device 10, the layer of the organic insulating material for forming the second insulating layer PAS2 may be used in a patterning process for forming the first contact electrode CNE1, and thus, the number of mask processes may be reduced. Accordingly, the display device 10 may have a structure in which the second insulating layer PAS2 covers the first end portion of the first contact electrode CNE1 while having the second contact electrode CNE2 located on one side surface thereof.

The second insulating layer PAS2 might not be located in the cut area CBA. A process of cutting and dividing the electrodes RME1, RME2, and the patterning process for forming the first contact electrode CNE1 may be performed at substantially the same time in the cut area CBA. That is, the layer of the organic insulating material for forming the second insulating layer PAS2 may be used not only in the patterning process for forming the first contact electrode CNE1, but also in the process of cutting and dividing the electrodes RME1, RME2 in the cut area CBA.

Figure 6:
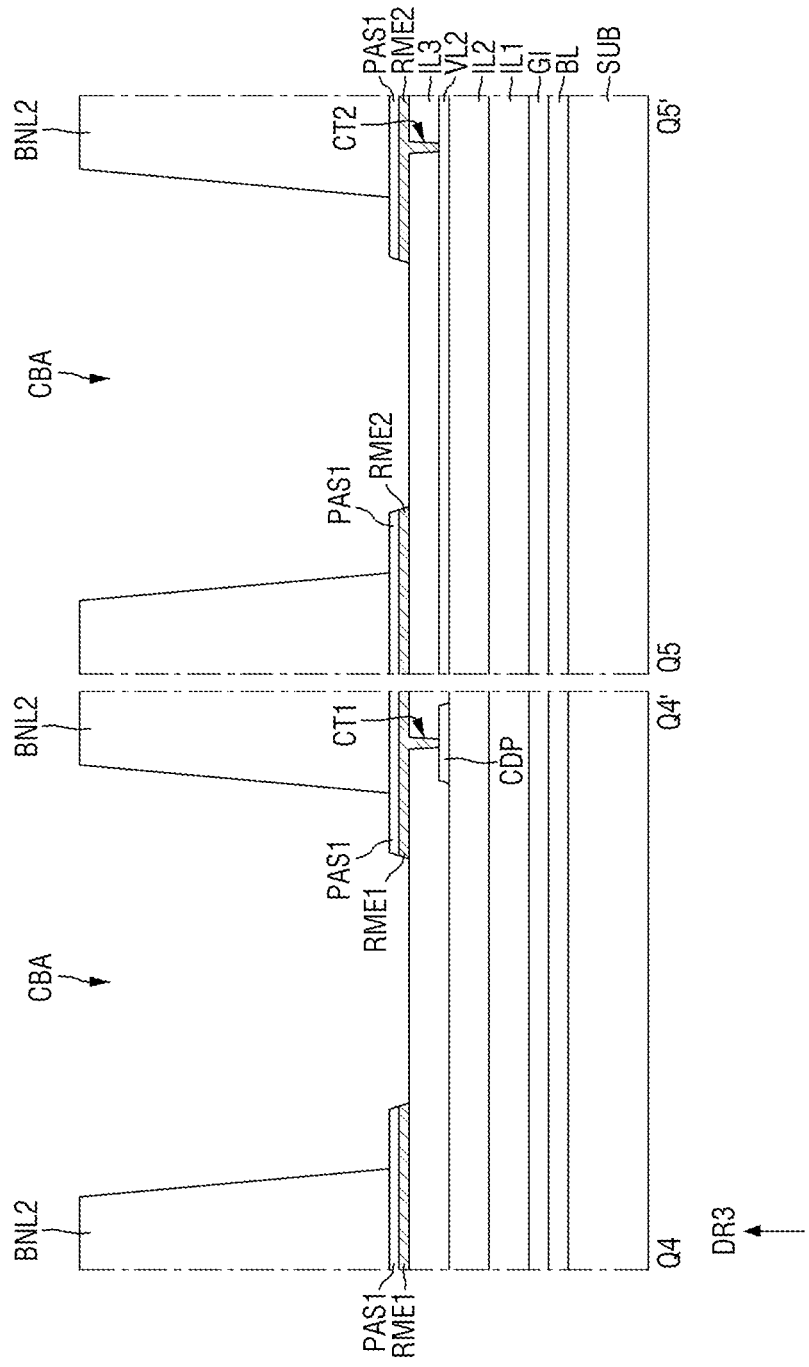
FIG. 6 is a cross-sectional view taken along the lines Q4-Q4' and Q5-Q5' of FIG. 3.

FIG. 6 is a cross-sectional view taken along the lines Q4-Q4' and Q5-Q5' of FIG. 3. FIG. 6 is a cross-sectional view taken along the cut area CBA, and illustrates how the first and second electrodes RME1 and RME2 of the first subpixel PX1 are cut and divided/separated from first and second electrodes RME1 and RME2 of the neighboring subpixel PXn of the first subpixel PXn in the second direction DR2.

Referring to FIG. 6, the first and second electrodes RME1 and RME2 and the first insulating layer PAS1 may be cut and divided in the cut area CBA, and the third interlayer insulating layer IL3, which is located below the first and second electrodes RME1 and RME2 and the first insulating layer PAS1, may be exposed. The electrodes RME1, RME2 may be initially formed to extend continuously in the second direction DR2, and may be cut and divided in the cut area CBA after the alignment of the light-emitting elements ED. Portions of the electrodes RME1, RME2 and the first insulating layer PAS1 may be removed together during the process of cutting and dividing the electrodes RME1, RME2, and the third interlayer insulating layer IL3 may be exposed in areas where portions of the electrodes RME1, RME2 and the first insulating layer PAS1 are removed. During the process of cutting and dividing the electrodes RME1, RME2, a portion of the layer of the organic insulating material for forming the second insulating layer PAS2, which is located in the cut area, may be used as a mask. Once the electrodes RME1, RME2 are divided, the layer of the organic insulating material for forming the second insulating layer PAS2 may be completely removed so that the second insulating layer PAS2 may be omitted from the cut area CBA. However, the present disclosure is not limited to this, and another insulating layer may be located in the cut area CBA, in which the electrodes RME1, RME2 are cut and divided, to cover elements located on the third interlayer insulating layer IL3.

In some embodiments, an insulating layer may be further located on, and may cover, the second insulating layer PAS2, the contact electrodes CNE1, CNE2, and the second bank BNL2. The insulating layer may be located on the entire surface of the first substrate SUB to protect the elements located on the first substrate SUB from an external environment.

The first insulating layer PAS1 may include an inorganic insulating material, and the second insulating layer PAS2 may include an organic insulating material. For example, the first insulating layer PAS1 may include an inorganic insulating material such as SiOx, SiNx, SiOxNy, aluminum oxide (Al2O3), or aluminum nitride (AlN), but the present disclosure is not limited thereto. The first and second insulating layers PAS1 and PAS2 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the present disclosure is not limited thereto.

Figure 7:
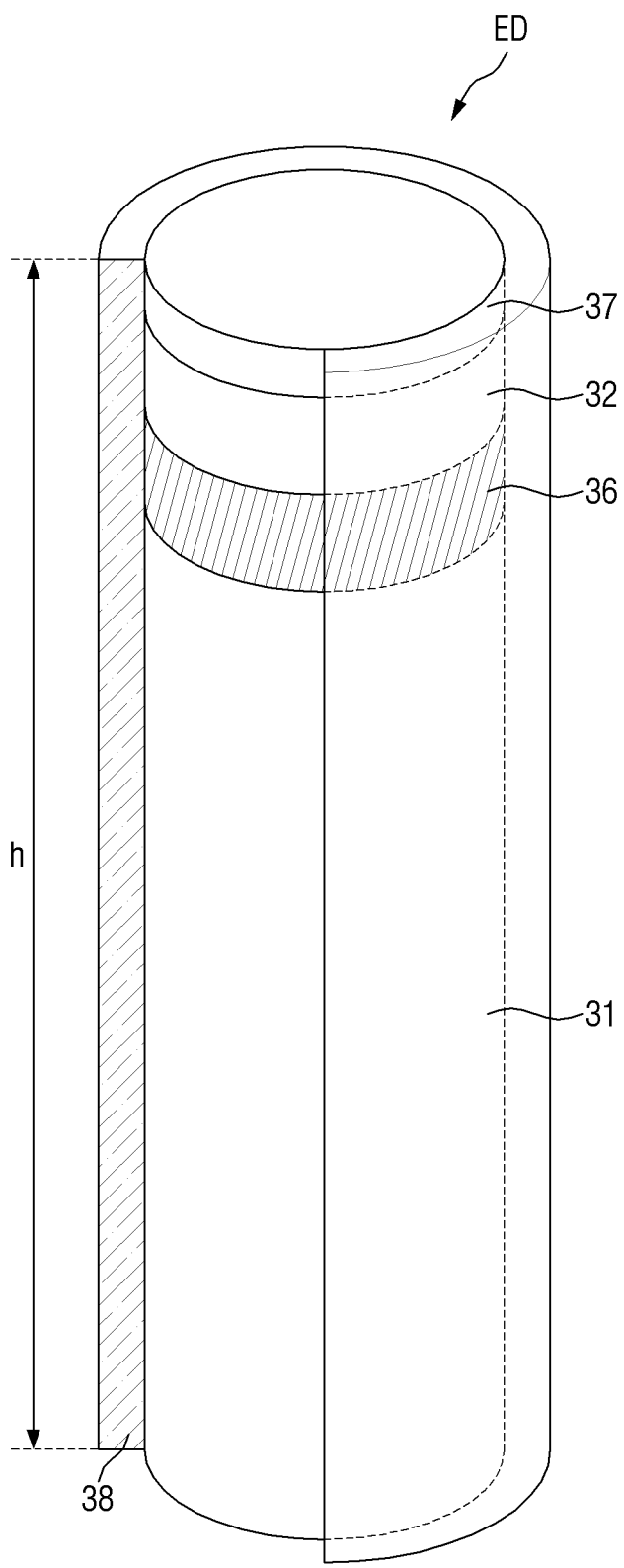
FIG. 7 is a perspective view of a light-emitting element according to some embodiments of the present disclosure.

FIG. 7 is a perspective view of a light-emitting element according to some embodiments of the present disclosure.

Referring to FIG. 7, a light-emitting element ED may be a light-emitting diode (LED), for example, an ILED having a size of several micrometers or nanometers and formed of an inorganic material. If an electric field is formed in a corresponding direction between two opposite electrodes, the ILED may be aligned between the two electrodes where polarities are formed. The light-emitting element ED may be aligned by the electric field formed between the two electrodes.

The light-emitting element ED may have a shape that extends in one direction. The light-emitting element ED may have the shape of a cylinder, a rod, a wire, or a tube, but the shape of the light-emitting element ED is not particularly limited. Alternatively, the light-emitting element ED may have the shape of a polygonal column such as a regular cube, a rectangular parallelepiped, or a hexagonal column or may have a shape that extends in one direction but with a partially inclined outer surface. A plurality of semiconductors included in the light-emitting element ED may be sequentially located or stacked in the direction in which the light-emitting element ED extends.

The light-emitting element ED may include semiconductor layers doped with impurities of an arbitrary conductivity type (e.g., a p-type or an n-type). The semiconductor layers may receive electrical signals from an external power source to emit light of a corresponding wavelength range.

Referring to FIG. 7, the light-emitting element ED may include a first semiconductor layer 31, a second semiconductor layer 32, a light-emitting layer 36, an electrode layer 37, and an insulating film 38.

The first semiconductor layer 31 may include an n-type semiconductor. In a case where the light-emitting element ED emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of about 1.5 μm to about 5 μm, but the present disclosure is not limited thereto. A second end portion of the light-emitting element ED may be a portion of the light-emitting element ED where the first semiconductor layer 31 is located with respect to the light-emitting layer 36.

The second semiconductor layer 32 is located on the light-emitting layer 36. The second semiconductor layer 32 may include a p-type semiconductor. In a case where the light-emitting element ED emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of about 0.05 µm to about 0.10 µm, but the present disclosure is not limited thereto. A first end portion of the light-emitting element ED may be a portion of the light-emitting element ED where the second semiconductor layer 32 is located with respect to the light-emitting layer 36.

The first and second semiconductor layers 31 and 32 are illustrated as being formed as single-layer films, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is located between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. For example, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 may emit blue light having a central wavelength range of 450 nm to 495 nm.

However, the present disclosure is not limited to this. Alternatively, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type of light emitted by the light-emitting layer 36 is not particularly limited. The light-emitting layer 36 may emit light of a red or green wavelength range as necessary, instead of blue light. The light-emitting layer 36 may have a length of about 0.05 µm to about 0.10 µm, but the present disclosure is not limited thereto.

Light may be emitted not only from the circumferential surface, in a length direction, of the light-emitting element ED, but also from both sides of the light-emitting element ED. The directionality of the light emitted from the light-emitting layer 36 is not particularly limited.

The electrode layer 37 may be an ohmic contact electrode, but the present disclosure is not limited thereto. Alternatively, the electrode layer 37 may be a Schottky contact electrode. The light-emitting element ED may include at least one electrode layer 37. FIG. 7 illustrates that the light-emitting element ED includes one electrode layer 37, but the present disclosure is not limited thereto. Alternatively, the light-emitting element ED may include more than one electrode layer 37, or the electrode layer 37 might not be provided. However, the following description of the light-emitting element ED may be directly applicable to a light-emitting element ED having more than one electrode layer 37 or having a different structure from the light-emitting element ED of FIG. 7.

The electrode layer 37 may reduce the resistance between the light-emitting element ED and electrodes (or contact electrodes) when the light-emitting element ED is electrically connected to the electrodes (or the contact electrodes). The electrode layer 37 may include a conductive metal. For example, the electrode layer 37 may include at least one of Al, T1, In, Au, Ag, ITO, IZO, and ITZO. Also, the electrode layer 37 may include a semiconductor material doped with an n- or p-type dopant. The electrode layer 37 may include the same material or different materials, but the present disclosure is not limited thereto.

The insulating film 38 is located to surround the first and second semiconductor layers 31 and 32 and the electrode layer 37. For example, the insulating film 38 may be located to surround at least the light-emitting layer 36 and may extend in the direction in which the light-emitting element ED extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element ED.

The insulating film 38 is illustrated as being formed to extend in the length direction of the light-emitting element ED and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32 or may cover only a portion of the side of the electrode layer 37 so that the side of the electrode layer 37 may be partially exposed. The insulating film 38 may be formed to be rounded in a cross-sectional view, in a region adjacent to at least one end of the light-emitting element ED.

The insulating film 38 may have a thickness of about 10 nm to about 1.0 µm, but the present disclosure is not limited thereto. Preferably, the insulating film 38 may have a thickness of about 40 nm.

The insulating film 38 may include a material with insulating properties such as, for example, SiOx, SiNx, SiOxNy, AlN, or $Al_2O_3$. The insulating film 38 is illustrated as being formed as a single layer, but the present disclosure is not limited thereto. In some embodiments, the insulating film 38 may be formed as a multilayer structure in which a plurality of layers are stacked. Accordingly, the insulating film 38 may reduce or prevent the likelihood of a short circuit that may occur when the light-emitting layer 36 is placed in direct contact with electrodes that transmit electrical signals directly to the light-emitting element ED. Also, because the insulating film 38 includes the light-emitting layer 36 to protect the outer surface of the light-emitting element ED, any degradation in the emission efficiency of the light-emitting element ED may be prevented.

The outer surface of the insulating film 38 may be subjected to surface treatment. The light-emitting element ED may be sprayed on electrodes while being scattered in predetermined ink. Here, the surface of the insulating film 38 may be hydrophobically or hydrophilically treated to keep the light-emitting element ED scattered in ink without agglomerating with other neighboring light-emitting elements ED. For example, the insulating film 38 may be surface-treated with a material such as stearic acid or 2,3-naphthalene dicarboxylic acid.

A length h of the light-emitting element ED may be in the range of about 1 μm to about 10 μm or about 2 μm to about 6 μm, for example, about 3 μm to about 5 μm. The light-emitting element ED may have a diameter of about 30 nm to about 700 nm and may have an aspect ratio of about 1.2 to about 100, but the present disclosure is not limited thereto. Different light-emitting elements ED included in the display device 10 may have different diameters depending on the composition of their respective light-emitting layers 36. Preferably, the light-emitting element ED may have a diameter of about 500 nm.

A method of fabricating the display device 10 will hereinafter be described.

Figure 8:
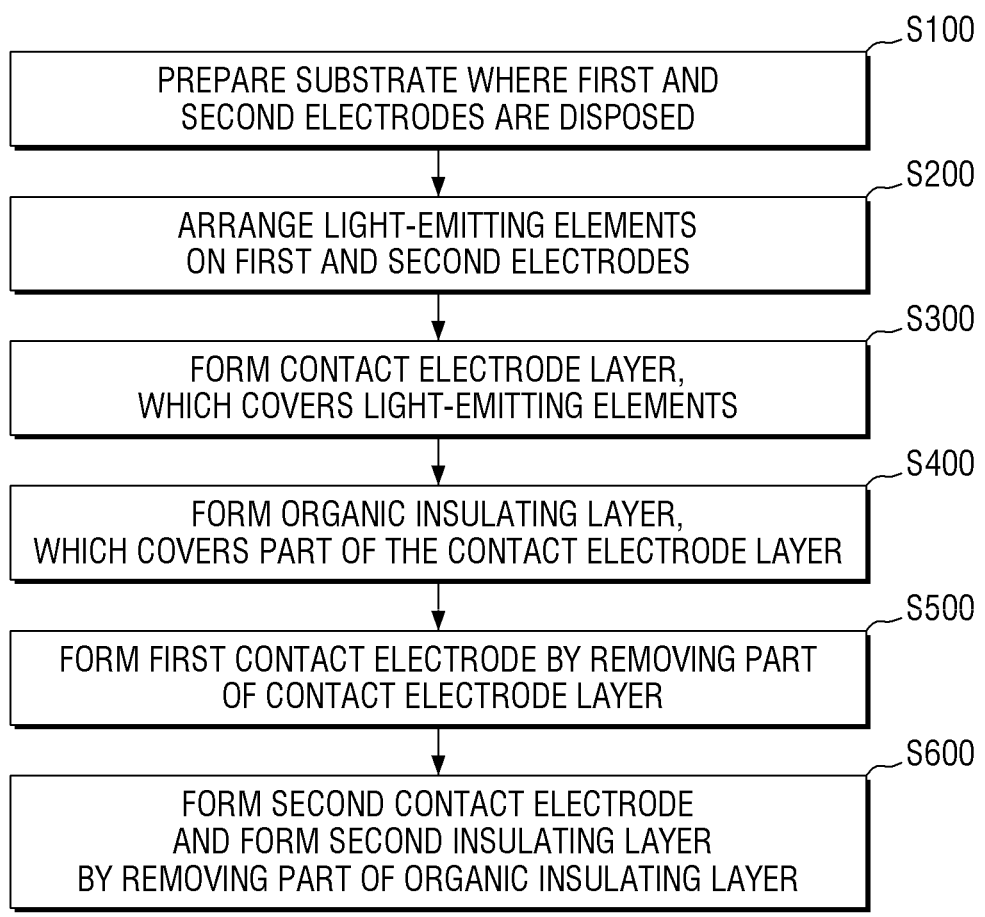
FIG. 8 is a flowchart illustrating a method of fabricating a display device according to some embodiments of the present disclosure.

FIG. 8 is a flowchart illustrating a method of fabricating a display device according to some embodiments of the present disclosure.

Referring to FIG. 8, the method of fabricating a display device may include: preparing a first substrate SUB where first and second electrodes RME1 and RME2 are located to be spaced apart from each other (S100); arranging light-emitting elements ED on the first and second electrodes RME1 and RME2 (S200); forming a contact electrode layer CML (of FIG. 11), which covers the light-emitting elements ED (S300); forming an organic insulating layer OIL, which covers the contact electrode layer CML (S400); forming a first contact electrode CNE1 by removing portion of the contact electrode layer CML (S500); and forming a second contact electrode CNE2 and forming a second insulating layer PAS2 by removing a portion of the organic insulating layer OIL.

The contact electrode layer CML may be used to fix, or secure, the light-emitting elements ED on electrodes RME1, RME2, and then may be patterned in part, thereby forming the first contact electrode CNE1. The organic insulating layer OIL may be used as a mask in the process of forming the first contact electrode CNE1 by patterning the contact electrode layer CML. After the formation of the second contact electrode CNE2, the organic insulating layer OIL may be patterned in part, thereby forming the second insulating layer PAS2. The method of fabricating the display device 10 will hereinafter be described in further detail, and descriptions of the structures of the elements of the display device 10, as well as how to form the elements of the display device 10, will be omitted or simplified.

FIGS. 9 through 17 are cross-sectional views illustrating processes of the method of FIG. 8.

Figure 9:
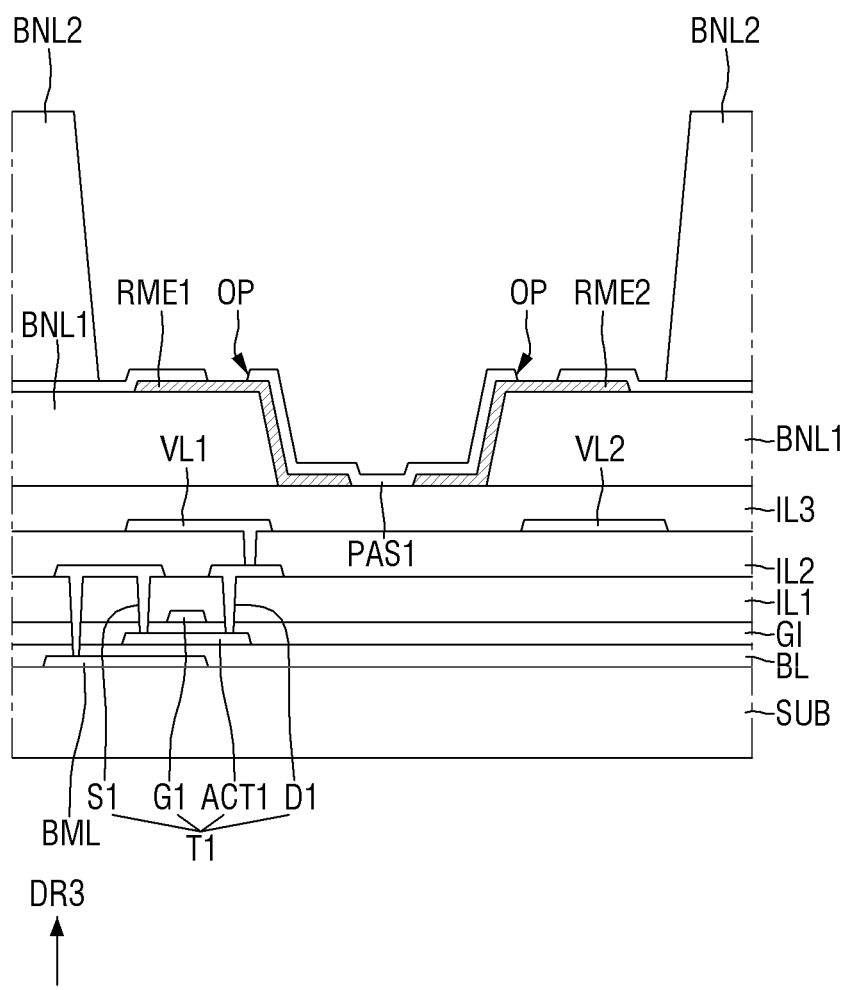
FIGS. 9 through 17 are cross-sectional views illustrating processes of the method of FIG. 8.

Referring to FIG. 9, a first substrate SUB where first and second electrodes RME1 and RME2 are formed is prepared (S100), and a first insulating layer PAS1, which covers portions of the first and second electrodes RME1 and RME2, and a second bank BNL2, which is located on the first insulating layer PAS1, are formed. A circuit layer and first banks BNL1 may be located between the first substrate SUB and electrodes RME1, RME2. The first insulating layer PAS1 may be located on the electrodes RME1, RME2 and the first banks BNL1 and may include openings OP, which expose portions of the top surfaces of the first and second electrodes RME1 and RME2. The second bank BNL2 may be located on the first insulating layer PAS1 to surround the area in which light-emitting elements ED are located. The structures and the relative arrangement of the first insulating layer PAS1, the first and second electrodes, the second bank BNL2, and the light-emitting elements ED may be as already described above.

In some embodiments, the first and second electrodes RME1 and RME2 may extend in the second direction DR2 across different subpixels PXn. After the arrangement of the light-emitting elements ED, the first and second electrodes RME1 and RME2 may be cut and divided between the different subpixels PXn by a subsequent line disconnecting process.

Figure 10:
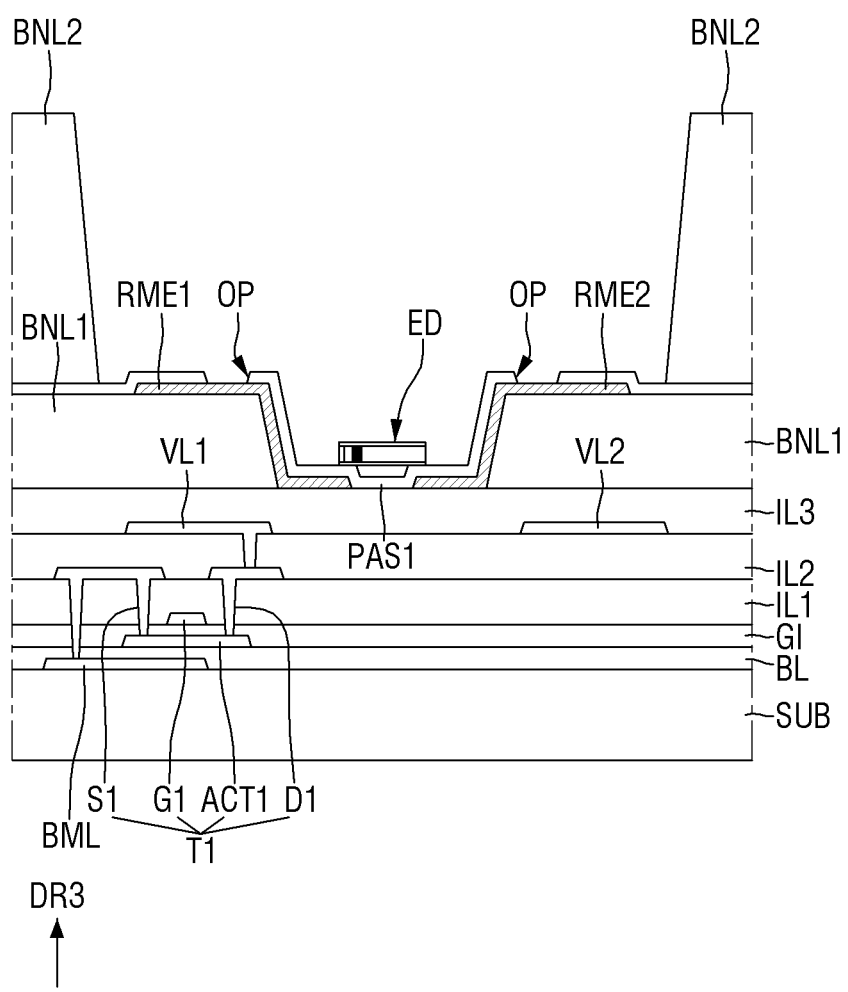

Thereafter, referring to FIG. 10, the light-emitting elements ED are arranged on the first insulating layer PAS1 (S200). Ink having the light-emitting elements ED scattered therein may be prepared and may be sprayed into an emission area EMA via inkjet printing. The second bank BNL2 may reduce or prevent the ink from spilling over to emission areas EMA of neighboring subpixels PXn. Once the ink is sprayed into the emission area EMA, alignment signals are applied to the electrodes RME1, RME2 so that an electric field is generated on the electrodes RME1, RME2. The light-emitting elements ED scattered in the ink may receive a dielectrophoretic force from the electric field, and the locations and the alignment directions of the light-emitting elements ED may change. As a result, respective ends of each of the light-emitting elements ED may be arranged on different electrodes RME1, RME2.

Figure 11:
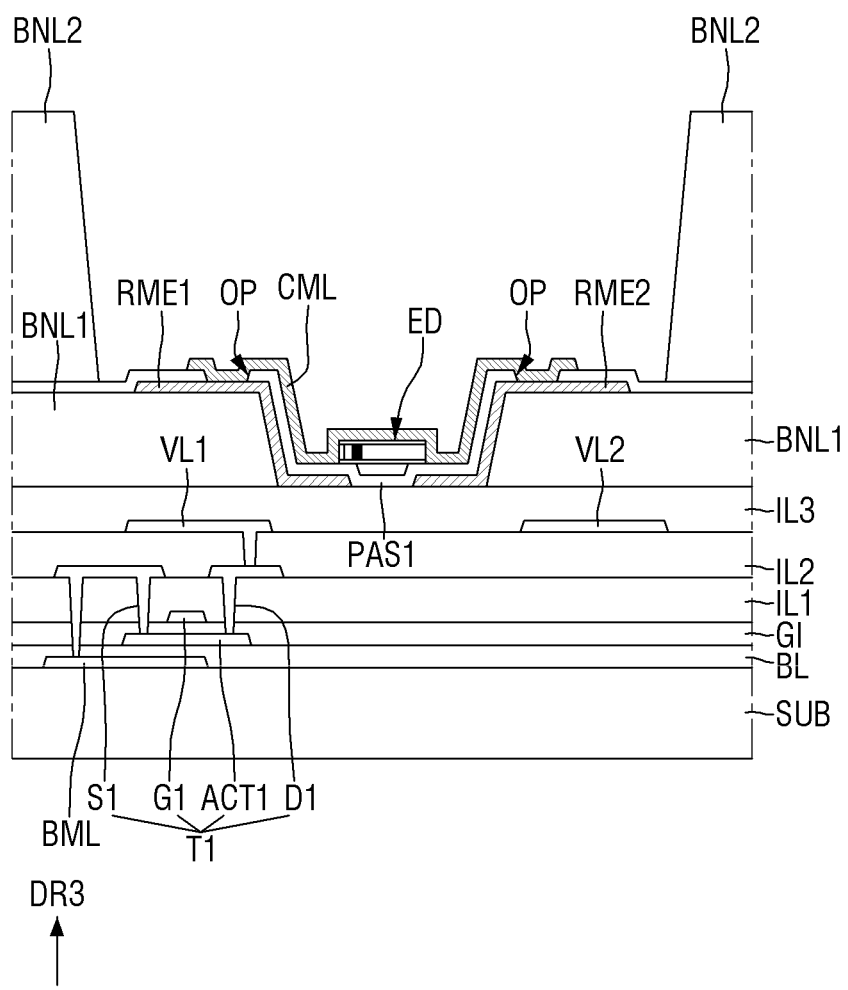

Thereafter, referring to FIG. 11, the contact electrode layer CML is formed on the light-emitting elements ED and the first insulating layer PAS1 (S300). The contact electrode layer CML may be located to cover the light-emitting elements ED and the openings OP, which are formed in the first insulating layer PAS1. Once the light-emitting elements ED are located on the first insulating layer PAS1, the contact electrode layer CML, which covers the light-emitting elements ED, may be formed to fix/secure the locations of the light-emitting elements ED. Because the light-emitting elements ED are fixed with the use of the contact electrode layer CML, which is for forming contact electrodes CNE1, CNE2, rather than with the use of an insulating layer, the number of manufacturing steps of the display device 10 may be reduced by at least one.

The contact electrode layer CML may include the same material as the contact electrodes CNE1, CNE2, may be located, in part, on the first and second electrodes RME1 and RME2, and may be in contact with the first and second electrodes RME1 and RME2 through the openings OP. In a subsequent process, the contact electrode layer CML may be patterned in part and then may be removed, thereby forming a first contact electrode CNE1.

Figure 12:
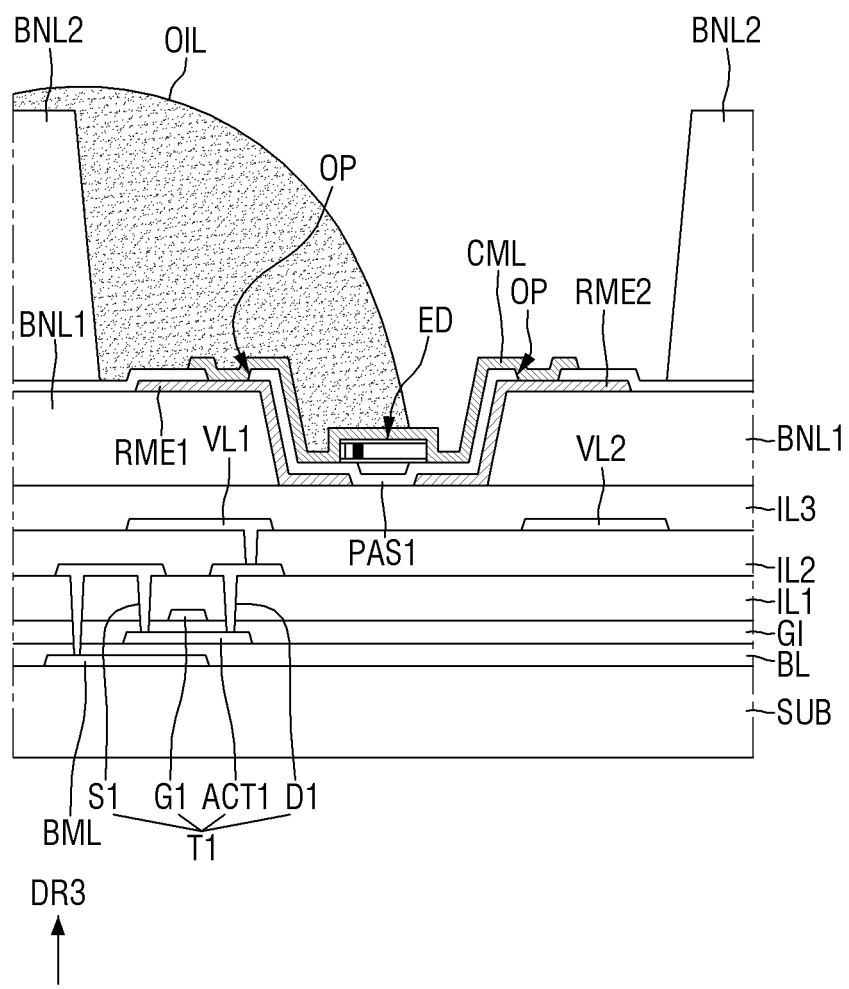

Thereafter, referring to FIG. 12, an organic insulating layer OIL including an organic insulating material is formed on the contact electrode layer CML. The organic insulating layer OIL may be located to cover portions of the contact electrode layer CML that are located on the first electrode RME1 and on the light-emitting elements ED. The organic insulating layer OIL may be formed by depositing an organic insulating material on an entirety of the surfaces of the contact electrode layer CML and the third interlayer insulating layer IL3, and by patterning the organic insulating material with the use of a mask. In a patterning process using a mask, the organic insulating layer OIL may be formed to not overlap with second end portions of the light-emitting elements ED in a thickness direction. In a subsequent process, a second contact electrode CNE2 may be located on, and may be in contact with, the second end portions of the light-emitting elements ED.

The organic insulating layer OIL may cover a portion of the contact electrode CML that is located on the first electrode RME1 in the emission area EMA surrounded by the second bank BNL2, and may be located in part on the second bank BNL2. The organic insulating layer OIL may be located to not completely cover the light-emitting elements ED. As a portion of the contact electrode layer CML, which is not located under the organic insulating layer OIL, but is instead exposed and then removed, the second end portions of the light-emitting elements ED may be exposed. The second contact electrode CNE2 may be located on the area from which the contact electrode layer CML is removed, and on the exposed second end portions of the light-emitting elements ED.

Figure 13:
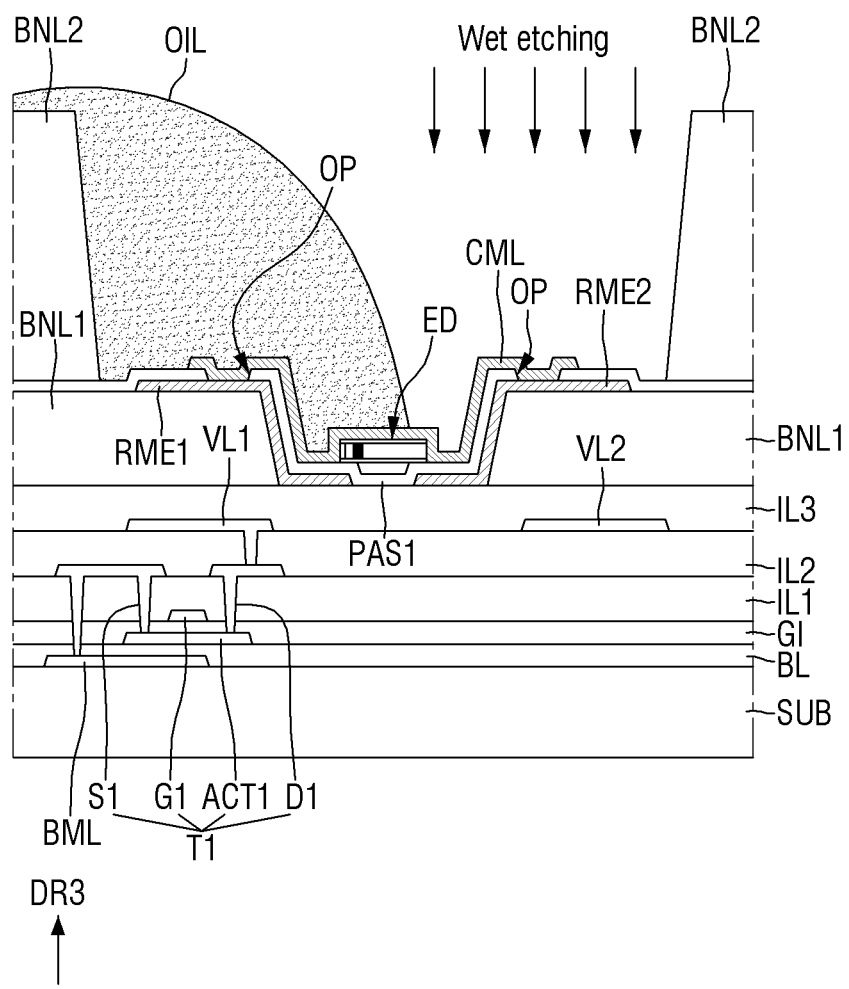
Figure 14:
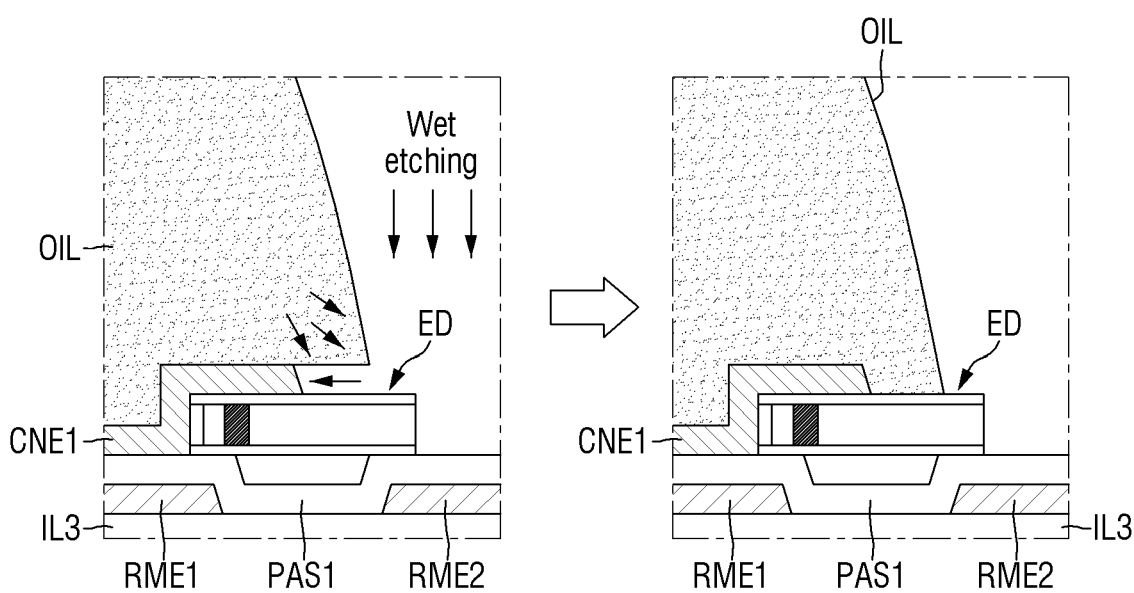

Thereafter, referring to FIGS. 13 and 14, the first contact electrode CNE1 is formed (S500) by patterning the contact electrode layer CML using the organic insulating layer OIL as a mask. Because the organic insulating layer OIL includes a material having a different etching selectivity from the contact electrode layer CML, the organic insulating layer OIL may be used as a mask during the patterning of the contact electrode layer CML. The first contact electrode CNE1 may be formed by patterning the contact electrode layer CML via wet etching when the organic insulating material of the organic insulating layer OIL is to be cured.

If the contact electrode layer CML is wet-etched using the organic insulating layer OIL as a mask, a portion of the contact electrode layer CML where the organic insulating layer OIL is not located may be removed. If the contact electrode layer CML is over-etched by wet etching, an undercut may be formed at an outermost portion of the contact electrode layer CML that is covered by the organic insulating layer OIL, and the patterned contact electrode layer CML may be recessed inwardly from the organic insulating layer OIL. The first contact electrode CNE1, which is formed by patterning the contact electrode layer CML, may be formed to cover the first end portions of the light-emitting elements ED, and second end portions of the light-emitting elements ED may be exposed.

If wet etching is performed when the organic insulating material of the organic insulating layer OIL has yet to be cured, the organic insulating material of the organic insulating layer OIL may move with fluidity. For example, in an area where the undercut of the contact electrode layer CML is formed, the organic insulating material of the organic insulating layer OIL may thereafter flow, and side surfaces of the light-emitting elements ED that are exposed by the undercut of the contact electrode layer CML may come into contact with the organic insulating layer OIL. Even if the organic insulating material of the organic insulating layer OIL flows due to the undercut of the contact electrode layer CML, the organic insulating material will flow only to the extent that second end portions of the light-emitting elements ED remain exposed. The organic insulating layer OIL may be located to cover a side surface of the first contact electrode CNE1 on the first end portions of the light-emitting elements ED, and in a subsequent process, a second insulating layer PAS2 may be formed to cover a first end portion of the first contact electrode CNE1.

According to the method of FIG. 8, a mask process using an additional insulating layer may be omitted by fixing the light-emitting elements ED with the contact electrode layer CML, which is for forming the first contact electrode CNE1. Also, because the patterning of the contact electrode layer CML is performed before the curing of the organic insulating layer OIL, the material of the organic insulating layer OIL may flow, and thus may be located directly on the light-emitting elements ED, and the second insulating layer PAS2 may insulate the first and second contact electrodes CNE1 and CNE2 from each other, and thus may reduce or prevent the likelihood of the first and second contact electrodes CNE1 and CNE2 being in direct contact with each other.

The organic insulating layer OIL may extend beyond the second bank BNL2 to be located, in part, in a cut area CBA. In a portion of the cut area CBA where the organic insulating layer OIL is not located, the first insulating layer PAS1 may be exposed, and the corresponding portion of the cut area CBA may be patterned so that each of the electrodes RME1, RME2 may be cut and divided between adjacent subpixels PXn.

Figure 15:
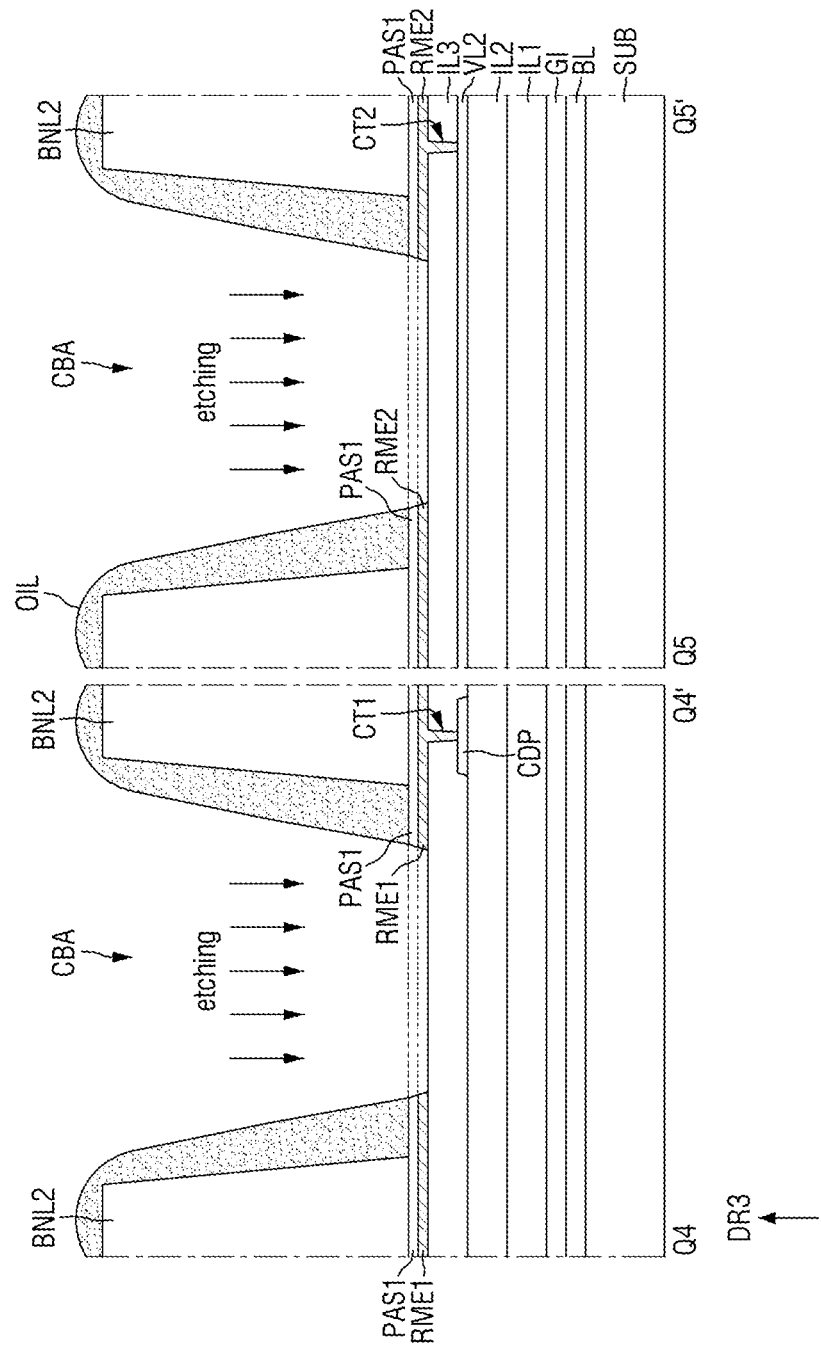

Referring to FIG. 15, the organic insulating layer OIL may be located in the cut area CBA to expose a portion of the top surface of the first insulating layer PAS1. After the patterning of the contact electrode layer CML, a process of cutting and dividing the electrodes RME1, RME2 while using the organic insulating layer OIL as a mask may be performed. When the light-emitting elements ED are being arranged, the electrodes RME1, RME2 may be formed to be connected between adjacent pixels PXn in the cut area CBA. Once the contact electrode layer CML for fixing the light-emitting elements ED is formed, the electrodes RME1, RME2 may be cut and divided in the cut area CBA so that each subpixel PXn may be driven separately.

The electrodes RME1, RME2 may be cut and divided by an etching process, and because the organic insulating layer OIL is formed to expose a portion of the cut area CBA, the organic insulating layer OIL may be used as a mask during the cutting and dividing of the electrodes RME1, RME2. Because the organic insulating layer OIL may be used as a mask during not only the patterning of the contact electrode layer CML, but also during the cutting and dividing of the electrodes RME1, RME2 in the cut area CBA, another mask process may be further omitted from the fabrication of the display device 10. The first insulating layer PAS1 and the electrodes RME1, RME2, which are initially connected from portion to portion throughout the cut area CBA, may be exposed in the portion of the cut area CBA where the organic insulating layer OIL is not located, as indicated by dotted lines of FIG. 15, and then may be cut and divided by dry or wet etching. As a result, a portion of the third interlayer insulating layer IL3 may be exposed.

Figure 16:
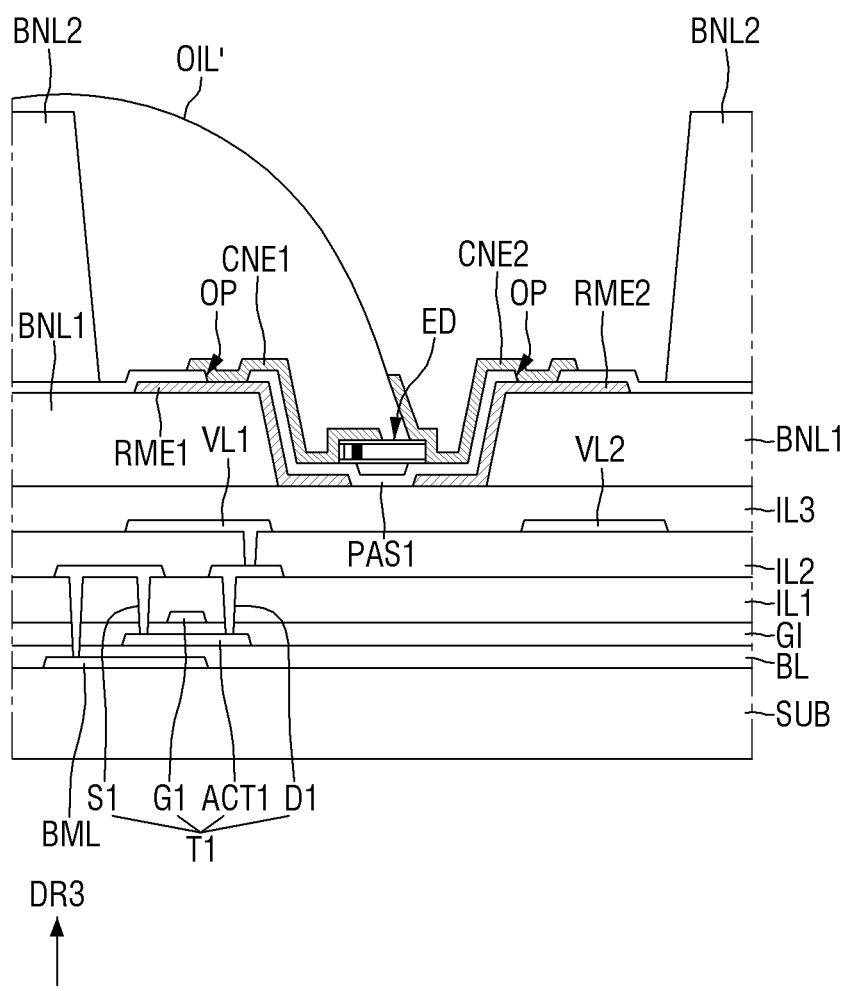
Figure 17:
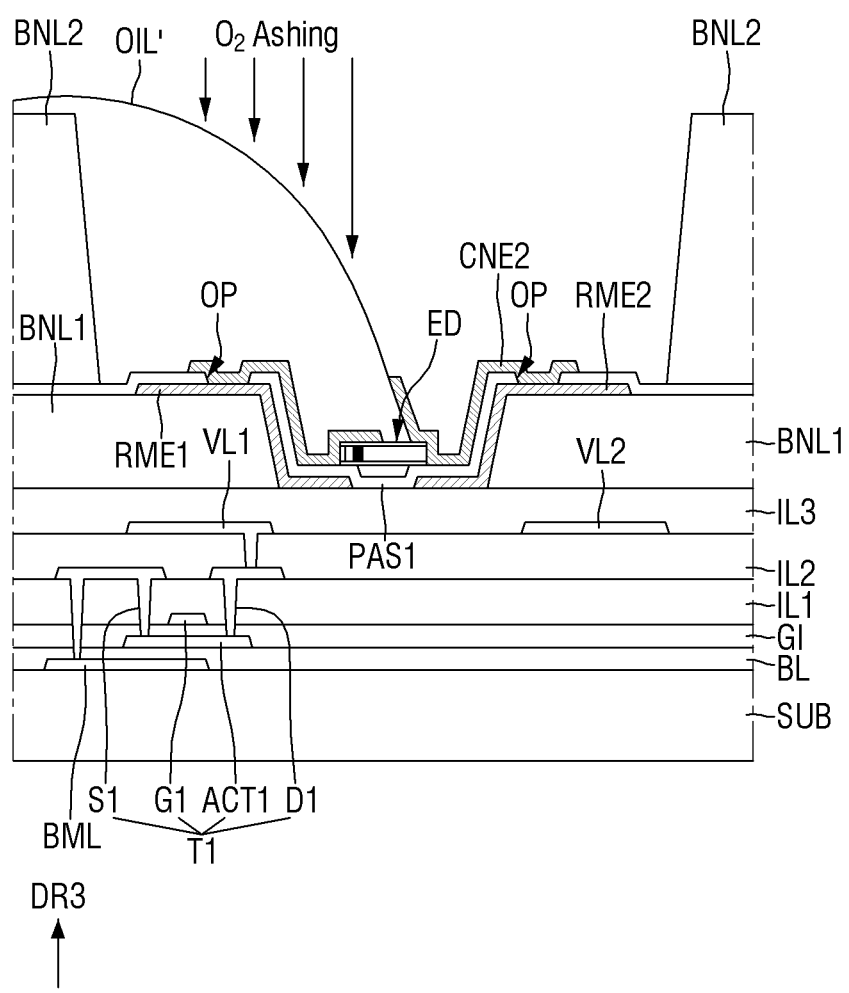

Thereafter, referring to FIGS. 16 and 17, an organic insulating layer OIL' is obtained by curing the organic insulating layer OIL, the second contact electrode CNE2 is formed, and the second insulating layer PAS2 is formed by patterning the organic insulating layer OIL' (S600). Once the organic insulating material of the organic insulating layer OIL, which is yet to be cured, flows to cover the first end portion of the first contact electrode CNE1, the organic insulating layer OIL is cured so that the organic insulating material of the organic insulating layer OIL does not flow any further. The position and the shape of the organic insulating layer OIL' may be fixed without fluidity, and the organic insulating layer OIL' may cover the first contact electrode CNE1.

The second contact electrode CNE2 may be located on the second end portions of the light-emitting elements ED, which are exposed by removing the contact electrode layer CML. An opening OP that exposes a portion of the top surface of the second electrode RME2 may be located in an area from which the contact electrode layer CML is removed, and the second contact electrode CNE2 may be in contact with the second electrode RME2 through the opening OP. The second contact electrode CNE2 may be located, in part, on the organic insulating layer OIL'. A portion of the second contact electrode CNE2 that is located on the organic insulating layer OIL' may be used as a mask during not only the patterning of the organic insulating layer OIL', and the patterned organic insulating layer OIL' may form the second insulating layer PAS2.

The patterning of the organic insulating layer OIL' may be performed by ashing (e.g., oxygen (02) ashing), but the present disclosure is not limited thereto. A portion of the organic insulating layer OIL' where the second contact electrode CNE2 is not formed may be removed by ashing, and a portion of the organic insulating layer OIL' that remains between the first and second contact electrodes CNE1 and CNE2 may form the second insulating layer PAS2. A first side surface of the second insulating layer PAS2, which is formed by ashing, may be located on the first end portion of the first contact electrode CNE1, and a second side surface of the second insulating layer PAS2 may be covered by the second contact electrode CNE2.

In this manner, the display device 10 may be obtained. Because the light-emitting elements ED may be fixed with the contact electrode layer CML, and because the organic insulating layer OIL may be used as a mask, the number of mask processes may be reduced, as compared to a case where the light-emitting elements ED are fixed with an additional insulating layer.

Display devices according to other embodiments of the present disclosure will hereinafter be described.

Figure 18:
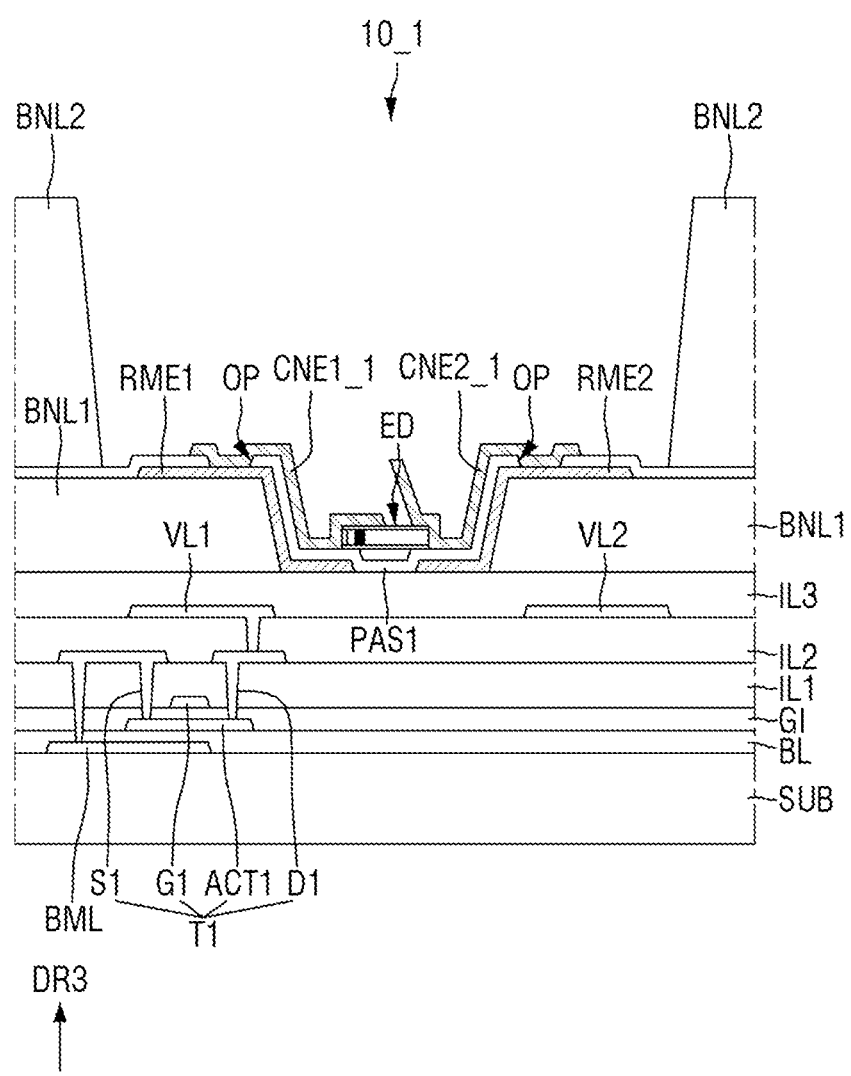
FIG. 18 is a cross-sectional view of a portion of a display device according to other embodiments of the present disclosure.

FIG. 18 is a cross-sectional view of a portion of a display device according to other embodiments of the present disclosure.

Referring to FIG. 18, a display device 10_1 might not include a second insulating layer PAS2, and may have portions of side surfaces of light-emitting elements ED exposed. A first end portion of a first contact electrode CNE1_1 that faces a second contact electrode CNE2_1 may be exposed, and a second end portion of the second contact electrode CNE2_1 that faces the first contact electrode CNE1_1 might not be covered, but may be exposed. The display device 10_1 differs from the display device 10 of FIG. 4 in that the second insulating layer PAS2 does not exist.

If the organic insulating layer OIL' is completely removed from between the first and second contact electrodes CNE1_1 and CNE2_1, the second insulating layer PAS2 might not remain. If a portion of the organic insulating layer OIL' that is covered by the second end portion of the second contact electrode CNE2_1 is reduced or minimized when the second contact electrode CNE2_1 is formed after the curing of the organic insulating layer OIL, the organic insulating layer OIL' may be completely removed by ashing. Because the organic insulating layer OIL' is located to completely cover the first end portion of the first contact electrode CNE1_1 through the formation of an undercut, the first and second contact electrodes CNE1_1 and CNE2_1 may be located to be spaced apart from each other. Also, because opposing side surfaces of the first and second contact electrodes CNE1_1 and CNE2_1 are exposed, the side surfaces of the light-emitting elements ED may be exposed between the first end portion of the first contact electrode CNE1_1 and the second end portion of the second contact electrode CNE2_1. According to the embodiment of FIG. 18, even if the second insulating layer PAS2 is not provided, a short circuit between the first and second contact electrodes CNE1_1 and CNE2_1 may be reduced or prevented. Also, the light-emitting elements ED may be fixed by a contact electrode layer CML or by the first contact electrode CNE1_1, and thus, the misalignment of the light-emitting elements ED may be reduced or prevented.

Figure 19:
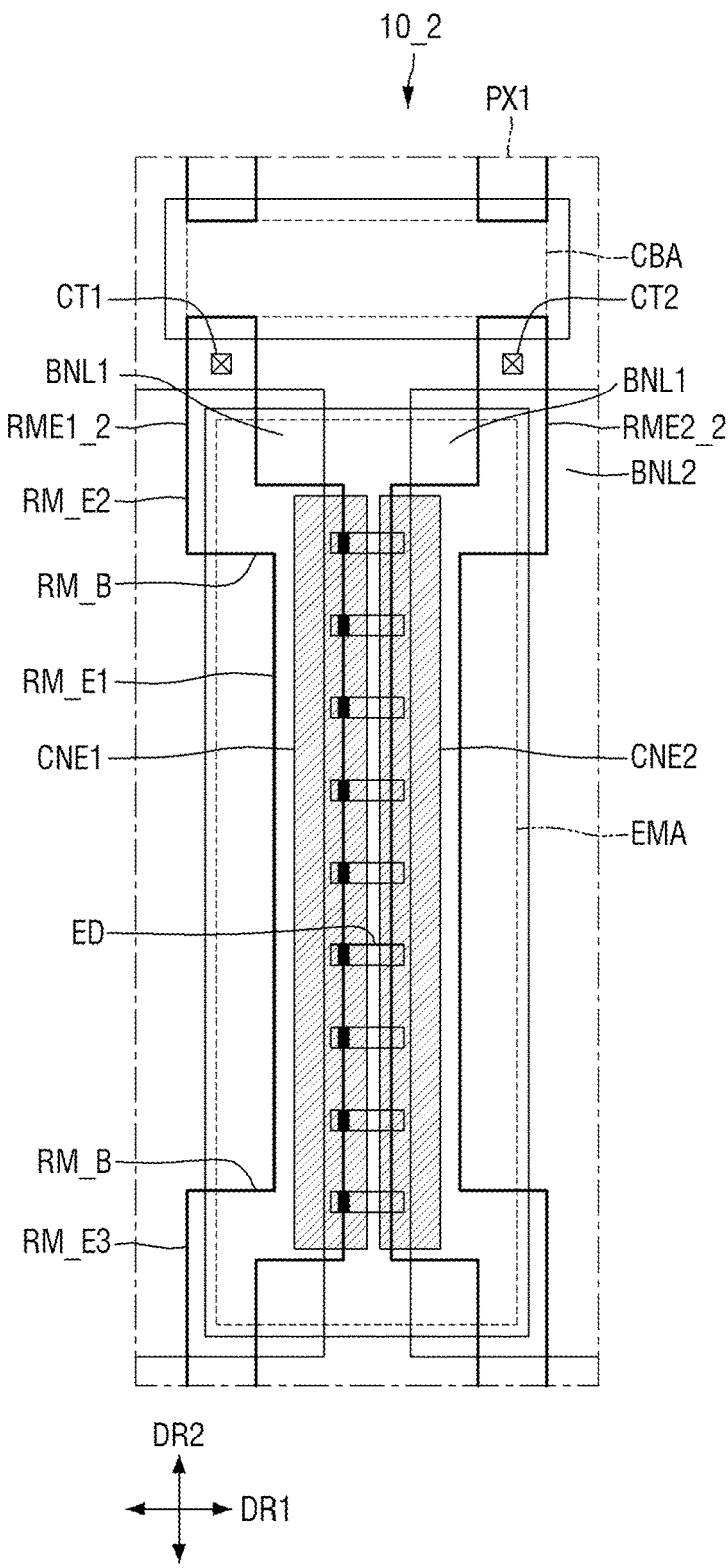
FIG. 19 is a plan view of a subpixel of a display device according to other embodiments of the present disclosure.

FIG. 19 is a plan view of a subpixel of a display device according to other embodiments of the present disclosure.

Referring to FIG. 19, first and second electrodes RME1_2 and RME2_2 of a display device 10_2 may be bent in part. Each of electrodes RME1_2, RME2_2 may include a plurality of electrode extensions RM_E1, RM_E2, RM_E3, which extend in one direction, and a plurality of electrode connectors RM_B, which connect the first, second, and third electrode extensions RM_E1, RM_E2, RM_E3. The display device 10_2 differs from the display device 10 of FIG. 3 in the shape of the electrodes RME1_2, RME2_2 and thus will hereinafter be described, focusing mainly on the shape of the electrodes RME1_2, RME2_2.

Each of the electrodes RME1_2, RME2_2 may include a first electrode extension RM_E1, which extends in a second direction DR2 in an emission area EMA, and second and third electrode extension RM_E1, which extend in the second direction DR2 across the second bank BNL2. The second electrode extension RM_E2 may be located above the first electrode extension RM_E1, and the third electrode extension RM_E3 may be located below the first electrode extension RM_E1. A first or second contact hole CT1 or CT2 may be formed in part of the second electrode extension RM_E2 that overlaps with the second bank BNL2 so that the second electrode extension RM_E2 may be connected to a third conductive layer below the second electrode extension RM_E2.

The first, second, and third electrode extensions RM_E1, RM_E2, and RM_E3 might not be aligned with one another in one direction. Each of the second and third electrode extensions RM_E2 and RM_E3 may be spaced apart from the first electrode extension RM_E1 in a diagonal direction or in a direction between a first direction DR1 and the second direction DR2, and the distance between the first and second electrodes RME1_2 and RME2_2 may differ from one location to another location. For example, the distance between the first electrode extensions RM_E1 of the first and second electrodes RME1_2 and RME2_2 may be smaller than the distance between the second electrode extensions RM_E2 or the third electrode extensions RM_E3 of the first and second electrodes RME1_2 and RME2_2, and light-emitting elements ED may be located on the first electrode extensions RM_E1 of the first and second electrodes RME1_2 and RME2_2. Contact electrodes CNE1, CNE2 may also be located on the first electrode extensions (RM_E1) of the first and second electrodes RME1_2 and RME2_2.

The electrode connectors RM_B may extend in a first direction DR1 to connect the first and second electrode extensions RM_E1 and RM_E2 or the first and third electrode extensions RM_E1 and RM_E3. Each of the electrodes RME1_2, RME2_2 may generally extend in the second direction DR2 and may be bent in part in the first direction DR1 via the electrode connectors RM_B.

As the electrodes RME1_2, RME2_2 are bent in part, there may exist an area where the distance between the electrodes RME1_2, RME2_2 is relatively small, and a strong electric field may be generated in the corresponding area. During the fabrication of the display device 10_2, the light-emitting elements ED may be densely arranged in an area where a strong electric field is generated, and the number of light-emitting elements ED that may be lost during inkjet printing may be reduced.

In the aforementioned embodiments, two electrodes (e.g., first and second electrodes RME1 and RME2) are provided in each subpixel PXn, but the present disclosure is not limited thereto. Alternatively, more than two electrodes may be provided in each subpixel PXn, and more light-emitting elements ED than there are in each subpixel PXn of each of the display devices 10, 10_1, and 10_2 may be provided accordingly.

Figure 20:
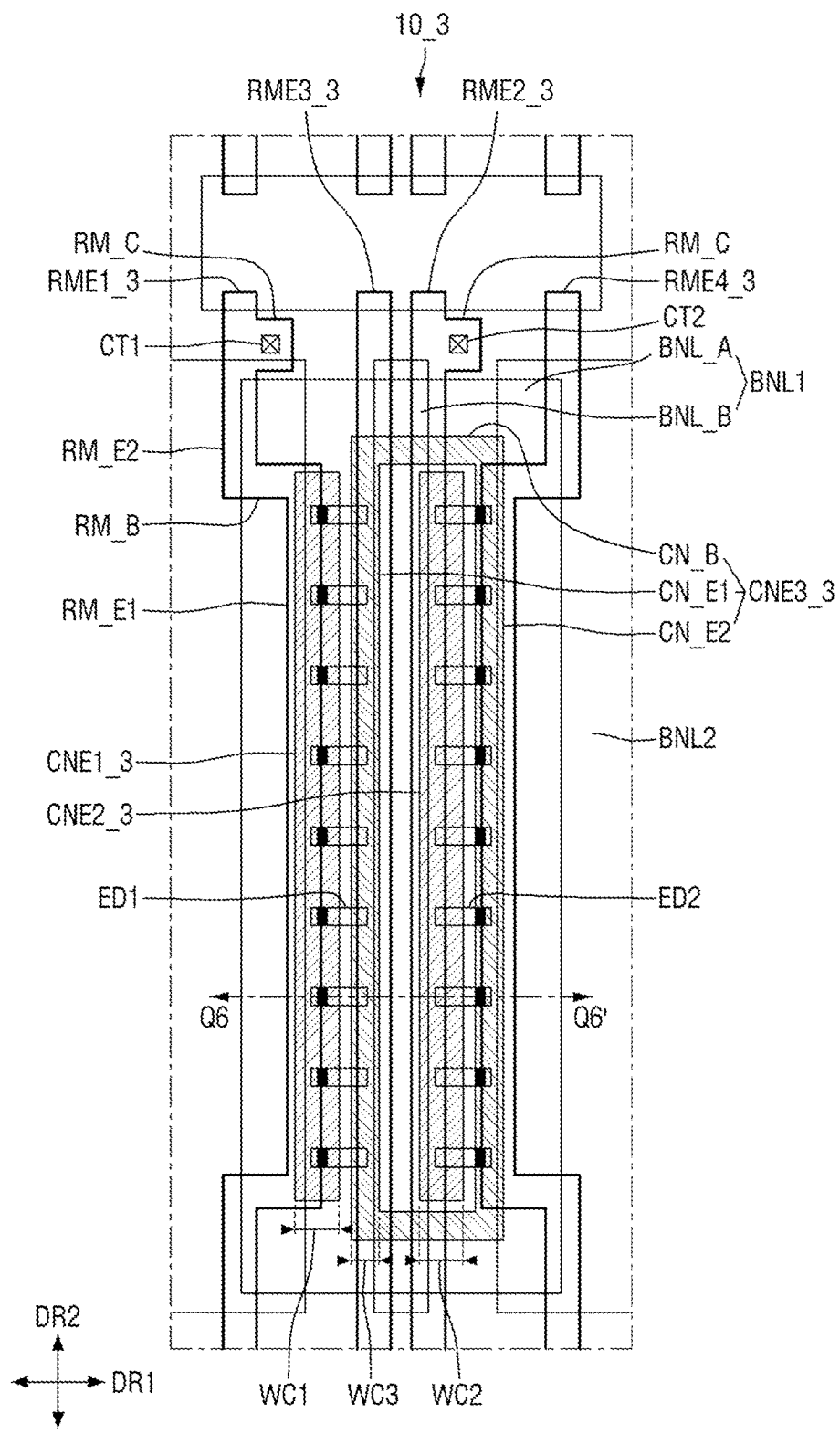
FIG. 20 is a plan view of a subpixel of a display device according to other embodiments of the present disclosure.
Figure 21:
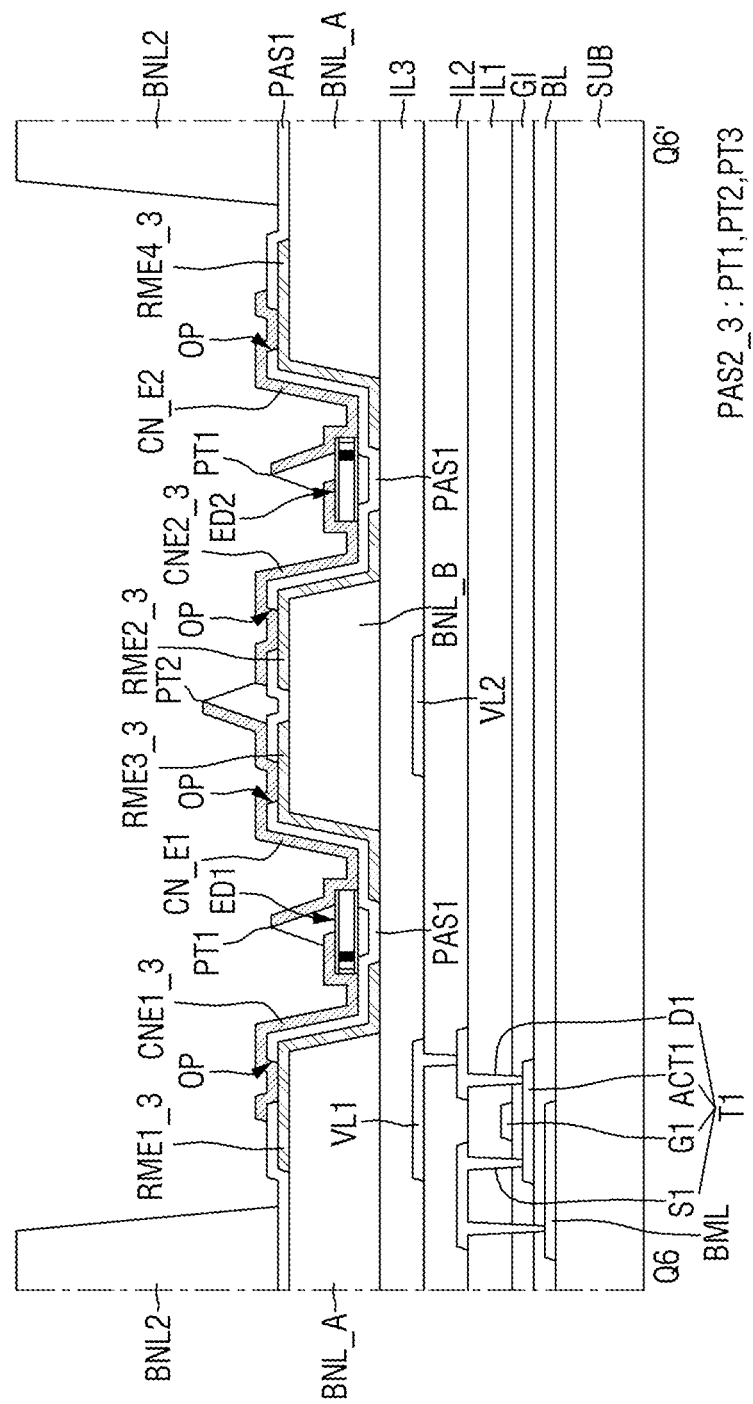
FIG. 21 is a cross-sectional view taken along Q6-Q6' of FIG. 20.

FIG. 20 is a plan view of a subpixel of a display device according to other embodiments of the present disclosure, and FIG. 21 is a cross-sectional view taken along Q6-Q6' of FIG. 20. FIG. 20 is a cross-sectional view taken from one end portion to the other end portion of each of first and second light-emitting elements ED1 and ED2.

Referring to FIGS. 20 and 21, a display device 10_3 may include, in each subpixel PXn, more than two electrodes RME1_3, RME2_3, RME3_3, RME4_3, light-emitting elements ED1, ED2, and contact electrodes CNE1_3, CNE2_3, CNE3_3. The display device 10_3 may include first, second, third, and fourth electrodes RME1_3, RME2_3, RME3_3, and RME4_3, first light-emitting elements ED1, which are located between the first and third electrodes RME1_3 and RME3_3, and second light-emitting elements ED2, which are located between the second and fourth electrodes RME2_3 and RME4_3. Because each subpixel PXn includes a relatively large number of light-emitting elements ED1, ED2, the luminance, per unit area, of the display device 10_3 may be improved. The third and fourth electrodes RME3_3 and RME4_3, unlike the first and second electrodes RME1_3 and RME2_3, might not be directly connected to a third conductive layer, and the first light-emitting elements ED1 and the second light-emitting elements ED2 may be connected in series via a third contact electrode CNE3_3.

First banks BNL1 may include first sub-banks BNL_A, which are respectively located between a pair of adjacent subpixels PXn, and a second sub-bank BNL_B, which is located between the first sub-banks BNL_A. The second sub-bank BNL2 may be located in the middle of an emission area EMA, and may extend in a second direction DR2. The first sub-banks BNL_A may be located on both sides of the second sub-bank BNL_B in a first direction DR1. The first banks BNL1 of FIGS. 20 and 21 differ from the first banks BNL1 of FIG. 3 in that they further include the second sub-bank BNL_B, which is located between the first sub-banks BNL_A that are substantially the same as the first banks BNL1 of FIG. 3 and that are spaced apart from one another in the first direction DR1.

The first and fourth electrodes RME1_3 and RME4_3 may have substantially the same shape as the first and second electrodes RME1_2 and RME2_2, respectively, of FIG. 19. The first electrode RME1_3 may differ from the first electrode RME1_2 of FIG. 19 in that it further includes an electrode contact RM_C in which a first contact hole CT1 is formed, and the fourth electrode RME4_3 may have the same shape as the second electrode RME2_2 of FIG. 19. The first and fourth electrodes RME1_3 and RME4_3 may be located on different first sub-banks BNL_A. The first electrode RME1_3 may be located on a left first sub-bank BNL_A on the left side of the center of the emission area EMA, and the fourth electrode RME4_3 may be located on a right first sub-bank BNL_A on the right side of the center of the emission area EMA. The second and third electrodes RME2_3 and RME3_3 may be located between the first and fourth electrodes RME1_3 and RME4_3.

An electrode contact RM_C with a relatively large width may be formed in a second electrode extension RM_E2 of the first electrode RME1_3, which is located on the upper side of the emission area EMA. The electrode contact RM_C may overlap with a second bank BNL2, and the first contact hole CT1 may be formed in the electrode contact RM_C.

The electrode contact RM_C may be formed in the first electrode RME1_3, while not being formed in the fourth electrode RME4_3. The fourth electrode RME4_3 might not be directly connected to the third conductive layer, and electrical signals may be transmitted to the fourth electrode RME4_3 via the third contact electrode CNE3_3.

The second and third electrodes RME2_3 and RME3_3 may have a similar shape to the first and second electrodes RME1 and RME2, respectively, of FIG. 3 and may be located between the first and fourth electrodes RME1_3 and RME4_3. The second and third electrodes RME2_3 and RME3_3 may be located on respective sides of the second bank BNL_B to be spaced apart from each other in the first direction DR1. The second electrode RME2_3 may be spaced apart from the fourth electrode RME4_3 in the first direction DR1 to be located on the right side of the second sub-bank BNL_B, and the third electrode RME3_3 may be spaced apart from the first electrode RME1_3 in the first direction DR1 to be located on the left side of the second sub-bank BNL_B. An electrode contact RM_C may be formed in part of the second electrode RME2_3 that overlaps with the second bank BNL2, and may be connected to a second voltage line VL2 via a second contact hole CT2. The third electrode RME3_3 might not be directly electrically connected to the third conducive layer and may receive electrical signals via the third contact electrode CNE3_3, like the fourth electrode RME4_3.

The first light-emitting elements ED1 may be located on the first and third electrodes RME1_3 and RME3_3, and the second light-emitting elements ED2 may be located on the second and fourth electrodes RME2_3 and RME4_3. The light-emitting elements ED1, ED2 may have a corresponding alignment direction, which is the direction faced by second end portions of the light-emitting elements ED1, ED2 where their respective first semiconductor layers 31 are located. As the display device 10_3 includes a relatively large number of electrodes RME1_3, RME2_3, RME3_3, RME4_3, the first end portions of the first light-emitting elements ED1 and the first end portions of the second light-emitting elements ED2 may face opposite directions. For example, the first end portions of the first light-emitting elements ED1 may be located on the third electrode RME3_3, second end portions of the first light-emitting elements ED1 that are opposite to the first end portions of the first light-emitting elements ED1 may be located on the first electrode RME1_3, and the first light-emitting elements ED1 may be arranged such that the first end portions thereof face one side, in the first direction DR1, of the display device 10_3. For example, the first end portions of the second light-emitting elements ED2 may be located on the second electrode RME2_3, second end portions of the second light-emitting elements ED2 that are opposite to the first end portions of the second light-emitting elements ED2 may be located on the fourth electrode RME4_3, and the second light-emitting elements ED2 may be arranged such that the first end portions thereof face the other side of the display device 10_3 in the first direction DR1. The first light-emitting elements ED1 and the second light-emitting elements ED2, which have an opposite alignment direction to that of the first light-emitting elements ED1, may be connected in series via the third contact electrode CNE3_3.

The first contact electrode CNE1_3 may be located on the first electrode RME1_3 to be in contact with the first end portions of the first light-emitting elements ED1. A second contact electrode CNE2_3 may be located on the second electrode RME2_3 to be in contact with the second end portions of the second light-emitting elements ED2. The first and second contact electrodes CNE1_3 and CNE2_3 may be in contact with the first and second electrodes RME1_3 and RME2_3, respectively, and may receive power supply voltages for driving the light-emitting elements ED1, ED2 via a first transistor T1 and the second voltage line VL2, respectively.

The third contact electrode CNE3_3 may be located on the third and fourth electrodes RME3_3 and RME4_3. The third contact electrode CNE3_3 may include first and second contact electrode extensions CN_E1 and CN_E2, which extend in the second direction DR2 and are located on the third or fourth electrode RME3_3 or RME4_3, and a plurality of contact electrode connectors CN_B, which connect the first and second contact electrode extensions CN_E1 and CN_E2. The first contact electrode extension CN_E1 of the third contact electrode CNE3_3 may be located on the third electrode RME3_3, and the second contact electrode extension CN_E2 of the third contact electrode CNE3_3 may be located on the fourth electrode RME4_3. The first and second contact electrode extensions CN_E1 and CN_E2 may extend in the second direction DR2, and the contact electrode connectors CN_B may extend in the first direction DR1 to connect the first and second contact electrode extensions CN_E1 and CN_E2. The third contact electrode CNE3_3 may be located to surround the second contact electrode CNE2_3 in a plan view.

The first and second contact electrode extensions CN_E1 and CN_E2 of the third contact electrode CNE3_3 may be in contact with the third or fourth electrode RME3_3 or RME4_3 and with the respective end portions of the light-emitting elements ED1, ED2. For example, the first contact electrode extension CN_E1 may be in contact with the third electrode RME3_3 and the first end portions of the first light-emitting elements ED1, and the second contact electrode extension CN_E2 may be in contact with the fourth electrode RME4_3 and the first end portions of the second light-emitting elements ED2.

The first and second contact electrodes CNE1_3 and CNE2_3 may be formed by patterning a contact electrode layer CML, which fixes/secures the light-emitting elements ED1, ED2. The third contact electrode CNE3_3 may be formed after the curing of an organic insulating layer OIL'. Widths WC1 and WC2 of the first and second contact electrodes CNE1_3 and CNE2_3 may be greater than the width of the first and second contact electrode extensions CN_E1 and CN_E2 of the third contact electrode CNE3_3.

A second insulating layer PAS2_3 may be located between the contact electrodes CNE1_3, CNE2_3, CNE3_3 and may insulate the contact electrodes CNE1_3, CNE2_3, CNE3_3 from one another. The second insulating layer PAS2 may include first insulating patterns PT1, which are located on the light-emitting elements ED1, ED2, and a second insulating pattern PT2, which is located on the second sub-bank BNL_B. The second insulating layer PAS2_3 may insulate the light-emitting elements ED1, ED2, and may be located on the second sub-bank BNL_B to insulate the contact electrodes CNE1_3, CNE2_3, CNE3_3 from one another.

For example, the first insulating patterns PT1 may be located between the first contact electrode CNE1_3 and the first contact electrode extension CN_E1, and also between the second contact electrode CNE2_3 and the second contact electrode extension CN_E2. Also, the first insulating patterns PT1 may be located between the first sub-banks BNL_A and the second sub-bank BNL_B. First side surfaces of the first insulating patterns PT1 may be located to cover the first and second contact electrodes CNE1_3 and CNE2_3, and second side surfaces of the first insulating patterns PT1 may be covered by the first and second contact electrode extensions CN_E1 and CN_E2. The second insulating pattern PT2 may be located on the second sub-bank BNL_B, between the first contact electrode extension CN_E1 and the second contact electrode CNE2_3. A first side surface of the second insulating pattern PT2 may be covered by the first contact electrode extension CN_E1, and a second side surface of the second insulating pattern PT2 that is opposite to the first side surface of the second insulating pattern PT2 may be located on a second end portion of the second contact electrode CNE2_3.

Power supply voltages may be applied to the first light-emitting elements ED1 and the second light-emitting elements ED2 via the first and second contact electrodes CNE1_3 and CNE2_3, respectively. The power supply voltages may flow through the light-emitting elements ED1, ED2, and may flow through the third contact electrode CNE3_3, between the first light-emitting elements ED1 and the second light-emitting elements ED2. The third contact electrode CNE3_3 may form connection paths between the first light-emitting elements ED1 and the second light-emitting elements ED2, and the first light-emitting elements ED1 and the second light-emitting elements ED2 may be connected in series via the third contact electrode CNE3_3. The third contact electrode CNE3_3 may be in contact with the third and fourth electrodes RME3_3 and RME4_3. Thus, even if the third and fourth electrodes RME3_3 and RME4_3 are not directly connected to a circuit layer therebelow, the third and fourth electrodes RME3_3 and RME4_3 may be electrically connected to the circuit layer, rather than being floated, when the power supply voltage flow.

In concluding the detailed description, those skilled in the art will appreciate that many variations and modifications can be made to the disclosed embodiments without substantially departing from the aspects of the present disclosure. Therefore, the disclosed embodiments are used in a generic and descriptive sense only and not for purposes of limitation.

What is claimed is:
1. A display device comprising:
a first substrate;
first and second electrodes on the first substrate and spaced apart from each other;
a first insulating layer covering portions of the first and second electrodes;
light-emitting elements on the first insulating layer;
a first contact electrode on the first electrode, in contact with first end portions of the light-emitting elements, and having a first end portion contacting top surfaces of the light-emitting elements;
a second insulating layer on the light-emitting elements, covering the first end portion of the first contact electrode, and that is narrower than the light-emitting elements in plan view;
a second contact electrode between the second insulating layer and the second electrode, and in contact with second end portions of the light-emitting elements;
first banks between the first substrate and the first and second electrodes, and comprising first sub-banks spaced apart from each other, and a second sub-bank between the first sub-banks;
a fourth electrode; and
a third electrode between the second and fourth electrodes, wherein a portion of a bottom surface of the second insulating layer is in direct contact with the light-emitting elements, wherein at least a portion of the light-emitting elements overlaps the first electrode and the second electrode in a thickness direction, wherein the second electrode is between the first and third electrodes, and wherein the second and third electrodes are spaced apart from each other on the second sub-bank.

2. The display device of claim 1, wherein the first and second contact electrodes are spaced apart from each other, and wherein a height of the first end portion of the first contact electrode facing the second contact electrode is less than a height of a second end portion of the second contact electrode facing the first contact electrode.

3. The display device of claim 1, wherein another portion of the bottom surface of the second insulating layer is in direct contact with a top surface of the first end portion of the first contact electrode.

4. The display device of claim 1, wherein a width of the second insulating layer decreases from a bottom to a top thereof.

5. The display device of claim 1, wherein a first side surface of the second insulating layer that is on the first contact electrode is exposed, and wherein a second side surface of the second insulating layer that is opposite to the first side surface of the second insulating layer is covered by the second contact electrode.

6. The display device of claim 1, wherein a width of the first contact electrode is greater than a width of the second contact electrode in one direction, and wherein contact areas of the top surfaces of the light-emitting elements and the first contact electrode are greater than contact areas of the top surfaces of the light-emitting elements and the second contact electrode.

7. The display device of claim 1, wherein the second insulating layer comprises an organic insulating material, wherein the first insulating layer comprises an inorganic insulating material, and wherein a maximum thickness of the second insulating layer is greater than a thickness of the first insulating layer.

8. The display device of claim 1, wherein the first end portions of the light-emitting elements overlap the first electrode in plan view, and wherein the second end portions of the light-emitting elements overlap the second electrode in plan view.

9. The display device of claim 1, wherein the first insulating layer defines openings, which expose a portion of the first electrode and a portion of the second electrode, wherein the first contact electrode is in contact with the exposed portion of the first electrode through the openings, and wherein the second contact electrode is in contact with the exposed portion of the second electrode through the openings.

10. The display device of claim 1, wherein the second insulating layer comprises first insulating patterns, which are between the first sub-banks and the second sub-bank, and a second insulating pattern, which is on the second sub-bank.

11. A display device comprising:
a first substrate;
first and second electrodes on the first substrate to be spaced apart from each other;
light-emitting elements on the first and second electrodes;
a first contact electrode on first end portions of the light-emitting elements and the first electrode, and having a first end portion contacting top surfaces of the light-emitting elements; and
a second contact electrode on second end portions of the light-emitting elements that are opposite to the first end portions, on the second electrode, and spaced apart from the first contact electrode, wherein a height of a second end portion of the second contact electrode is greater than a height of the first end portion of the first contact electrode that is opposite to the second end portion of the second contact electrode, wherein the top surfaces of the light-emitting elements are exposed between the first and second contact electrodes, wherein the second end portion of the second contact electrode extends in a diagonal direction, wherein a space is formed between the second end portion of the second contact electrode and the top surfaces of the light-emitting elements overlapping with the second end portion of the second contact electrode, and wherein the space is left void.

12. The display device of claim 11, further comprising a first insulating layer covering portions of the first and second electrodes, wherein the light-emitting elements are directly on the first insulating layer.

13. The display device of claim 12, wherein contact areas of the top surfaces of the light-emitting elements and the first contact electrode are greater than contact areas of the top surfaces of the light-emitting elements and the second contact electrode.

14. A method of fabricating a display device, comprising:
preparing a substrate where first and second electrodes, which are spaced apart from each other, and a first insulating layer, which covers portions of the first and second electrodes, are formed;
arranging light-emitting elements on the first and second electrodes;
forming a contact electrode layer on the first and second electrodes and covering the light-emitting elements;
forming an organic insulating layer on the contact electrode layer;
forming a first contact electrode by wet etching the contact electrode layer before curing the organic insulating layer the contact electrode layer being patterned so that an undercut beneath the organic insulating layer is formed in the contact electrode layer;
forming a second contact electrode on portion of the organic insulating layer; and
forming a second insulating layer by removing another portion of the organic insulating layer.

15. The method of claim 14, wherein, in the forming the first contact electrode, a material that forms the organic insulating layer moves toward the undercut of the contact electrode layer to be in direct contact at least in part with the light-emitting elements.

16. The method of claim 14, wherein the forming the second insulating layer comprises removing a portion of the cured organic insulating layer via ashing where the second contact electrode is not formed.

17. The method of claim 14, wherein, after the forming the first contact electrode, the first and second electrodes are cut and divided at least in part in an area outside an area where the light-emitting elements are located.

\* \* \* \* \*